United States Patent
Fujiwara et al.

(10) Patent No.: US 6,775,219 B2
(45) Date of Patent: Aug. 10, 2004

(54) DATA REPRODUCTION CONTROL METHOD AND APPARATUS, AND OPTICAL DISK UNIT

(75) Inventors: Toru Fujiwara, Kato (JP); Akira Nanba, Kato (JP); Masakazu Taguchi, Kawaski (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/457,758

(22) Filed: Jun. 9, 2003

(65) Prior Publication Data

US 2003/0198169 A1 Oct. 23, 2003

Related U.S. Application Data

(62) Division of application No. 09/900,790, filed on Jul. 6, 2001, which is a continuation of application No. PCT/JP99/04490, filed on Aug. 20, 1999.

(30) Foreign Application Priority Data

Jan. 18, 1999 (JP) .................................. PCT/JP99/00133

(51) Int. Cl.$^7$ ................................................. G11B 5/09
(52) U.S. Cl. .............................. 369/59.21; 369/124.05; 369/124.13
(58) Field of Search ........................... 369/59.16, 59.19, 369/59.21, 59.22, 124.04, 124.05, 124.07, 124.13, 51, 65, 47.18, 47.26; 360/65

(56) References Cited

U.S. PATENT DOCUMENTS

| | | | |
|---|---|---|---|
| 4,774,681 A | 9/1988 | Frisch | |
| 5,287,385 A | * 2/1994 | Sugawara et al. | 360/65 |
| 5,424,882 A | 6/1995 | Kazawa | |
| 5,490,061 A | 2/1996 | Tolin et al. | |
| 5,719,843 A | 2/1998 | Nakajima et al. | |
| 5,745,464 A | 4/1998 | Taguchi et al. | |
| 5,796,693 A | 8/1998 | Taguchi et al. | |
| 6,028,727 A | 2/2000 | Vishakhadatta et al. | |
| 6,064,536 A | 5/2000 | Ebisawa et al. | |

FOREIGN PATENT DOCUMENTS

| | | |
|---|---|---|
| EP | 0 426 353 | 5/1991 |
| EP | 0 827 148 | 3/1998 |
| JP | 05-006549 | 1/1993 |
| JP | 06-259544 | 9/1994 |
| JP | 09-306104 | 11/1997 |
| JP | 09-320197 | 12/1997 |
| JP | 10-003538 | 1/1998 |
| JP | 10-199161 | 7/1998 |
| WO | WO97/24722 | 7/1997 |

* cited by examiner

Primary Examiner—Thang V. Tran
(74) Attorney, Agent, or Firm—Greer, Burns & Crain, Ltd.

(57) ABSTRACT

The present invention realizes stable and more proper data reproduction even when a reproduced signal varies locally due to a noise or includes a steady distortion. In a data reproduction control method and apparatus, and an optical disk unit that adjust sampled values, in sampling a signal reproduced from a recording medium recorded with data, the frequencies of the levels of quantized data are counted, a histogram of the frequencies of the levels is created based on the counting results, and more accurate reproduced data is obtained by means of a distribution of the frequencies of the levels in the histogram.

6 Claims, 32 Drawing Sheets

FIG.39

EXPECTED VALUE SETTING OF PR(1100)ML

|      | t-3 | t-2 | t-1 | t | EXPECTED VALUE |
|------|-----|-----|-----|---|----------------|
| Ph0  | 0   | 0   | 0   | 0 | 0              |
| Ph1  | 1   | 0   | 0   | 0 | 0              |
| Ph2  | 0   | 1   | 0   | 0 | D RESTRICTION  |
| Ph3  | 1   | 1   | 0   | 0 | 0              |
| Ph4  | 0   | 0   | 1   | 0 | D RESTRICTION  |
| Ph5  | 1   | 0   | 1   | 0 | D RESTRICTION  |
| Ph6  | 0   | 1   | 1   | 0 | 1              |
| Ph7  | 1   | 1   | 1   | 0 | 1              |
| Ph8  | 0   | 0   | 0   | 1 | 1              |
| Ph9  | 1   | 0   | 0   | 1 | 1              |
| Ph10 | 0   | 1   | 0   | 1 | D RESTRICTION  |
| Ph11 | 1   | 1   | 0   | 1 | D RESTRICTION  |
| Ph12 | 0   | 0   | 1   | 1 | 2              |
| Ph13 | 1   | 0   | 1   | 1 | D RESTRICTION  |
| Ph14 | 0   | 1   | 1   | 1 | 2              |
| Ph15 | 1   | 1   | 1   | 1 | 2              |

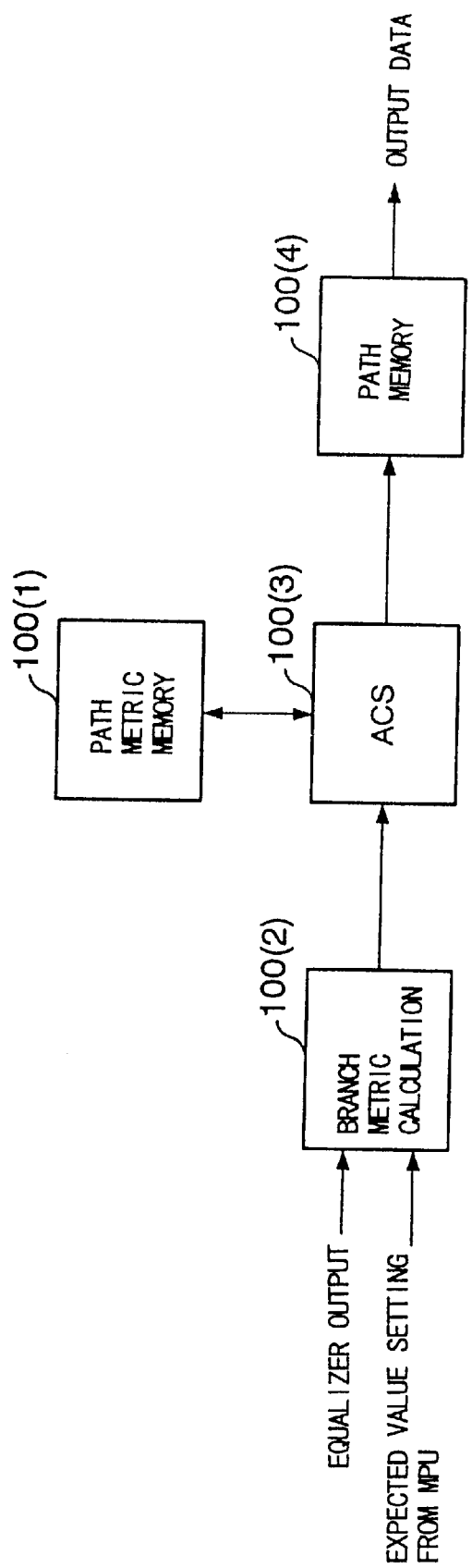

DATA REPRODUCTION CONTROL METHOD AND APPARATUS, AND OPTICAL DISK UNIT

This is a divisional of application Ser. No, 09/900,790, filed Jul. 6, 2001, which is a continuation of International Application No. PCT/JP99/04490, filed Aug. 20, 1999.

TECHNICAL FIELD

The present invention relates to a data reproduction control method and apparatus that control a data reproduction characteristic based on the distribution characteristic of quantized data obtained by quantizing a signal reproduced from a recording medium.

The present invention further relates to an optical disk unit that operates in accordance with such a data reproduction control method.

BACKGROUND ART

Recently, optical disk units, magneto-optical disk units, and magnetic disk units that are employed as auxiliary storages of a computer have required a data recording and reproduction method with higher accuracy in order to meet a demand for increase in the recording density of a recording medium.

Conventionally, as a method of recording data on and reproducing data from optical disk units, magneto-optical disk units, and magnetic disk units with high accuracy, the PRML (partial response maximum likelihood) technique has been proposed. By this PRML technique, a recording data signal is modulated into a so-called partial response (PR) waveform to be recorded on a recording medium, while a reproduced signal from the recording medium is sampled at regular intervals to be quantized so that the quantized data is subjected to waveform equalization to correspond to the partial response (PR) waveform. The reproduced signal may be sampled at regular intervals and quantized after being waveform-equalized to correspond to the partial response (PR) waveform. Then, from the resulting quantized data, data of maximum likelihood is determined in accordance with a maximum likelihood (ML) detection technique such as the so-called Viterbi detection.

The conventional PRML technique employs a(n) (adaptive equalization) technique that controls the characteristic of waveform equalization so as to minimize a difference between quantized data obtained by sampling and a value that is expected to be obtained from a partial response (PR) waveform. By thus controlling the characteristic of waveform equalization, quantized data corresponding to a signal waveform more similar to the partial response (PR) waveform can be obtained. Consequently, data reproduction can be performed with more accuracy.

However, such a technique to control the characteristic of waveform equalization as described above controls the equalization characteristic based on a local state of the reproduced signal. Therefore, if the reproduced signal varies locally due to a noise, stable and more proper data reproduction cannot be achieved.

Further, in order to realize high-density data recording, a medium having a magnetically induced super resolution effect (an MSR (Magnetic Super Resolution) medium), for instance, is about to be put into practical use. In this MSR medium, a super resolution effect is produced by forming a mask using the heat distribution of a light beam, so that a nonlinear distortion component is generated in the reproduced signal by a non-uniform heat distribution of the light beam moving on the medium. This nonlinear distortion component distorts the reproduced waveform.

This distortion appears as a droop phenomenon that occurs notably at a trailing or rising edge of the reproduced signal. Further, this distortion is not generated only at a given point, but is generated steadily.

Thus, there has been proposed a technique to reproduce two clock signals synchronizing with the trailing and rising edges of the reproduced signal, respectively, (PLL) and sample the reproduced signal by using the two clock signals (DUAL PLL system).

Even if the reproduced signal is distorted at a trailing or rising edge thereof, sampling can be performed at a timing corresponding to the distortion by sampling the reproduced signal by such clock signals synchronizing with the trailing and rising edges of the reproduced signal, respectively. Therefore, correct output data can be obtained.

However, the above-described DUAL PLL system has a complicated circuit structure because of its employment of the two clock signals to sample the reproduced signal. On the other hand, there is another method of sampling the reproduced signal which method employs a clock signal that facilitates circuit simplification (SINGLE PLL system). However, the SINGLE PLL method is prevented from obtaining correct output data in the case of sampling such a drooping waveform as described above.

DISCLOSURE OF THE INVENTION

It is a general object of the present invention to provide a useful data reproduction control method and apparatus, and a useful optical disk unit that are improved to eliminate the above-described disadvantage.

An object of the present invention is to provide a data reproduction control method and apparatus that can reproduce data stably and more properly with as simple a circuit structure as possible even when a reproduced signal varies locally due to a noise to be distorted or includes a steady distortion at a trailing or rising edge thereof.

A more specific object of the present invention is to provide a data reproduction control method and apparatus that can reproduce data stably and more properly even when a reproduced signal varies locally due to a noise.

The above objects of the present invention are achieved by a data reproduction control method controlling a distribution characteristic of quantized data by adjusting a waveform equalization characteristic at a time of performing quantization and waveform equalization on a signal reproduced from a recording medium recorded with data in accordance with a given recording code, wherein frequencies of levels of the quantized data are counted, and the waveform equalization characteristic is adjusted so that a distribution of the counted frequencies of the levels approaches a distribution that should be obtained based on the given recording code.

The above objects of the present invention are also achieved by a data reproduction control apparatus controlling a distribution characteristic of quantized data by adjusting a waveform equalization characteristic of a waveform equalizer when a signal reproduced from a recording medium recorded with data in accordance with a given recording code is subjected to operations in quantization means and the waveform equalizer, which data reproduction control apparatus includes counting means for counting frequencies of levels of the quantized data, and equalization characteristic adjustment means for adjusting the waveform equalization characteristic of the waveform equalizer so that a distribution of the frequencies of the levels obtained in the counting means approaches a distribution that should be obtained based on the given recording code.

According to the above-described method and apparatus of the present invention, by setting a period of signal reproduction relatively long, the frequencies of the levels of quantized data are counted based on a larger amount of quantized data. Waveform equalization characteristic is adjusted based on a distribution of the thus obtained frequencies of the levels of the quantized data. As a result, the waveform equalization characteristic is adjustable so that a more proper waveform equalization output can be obtained even if a reproduced signal varies locally.

In another mode of the present invention, the frequencies of the levels of the quantized data may be counted at given intervals in the period of signal reproduction from the recording medium.

In yet another mode of the present invention, a given number of periods of signal reproduction from the recording medium may be set, and the frequencies of the levels of the quantized data may be counted and the waveform equalization characteristic may be adjusted in each of the periods of signal reproduction.

In another mode of the present invention, the waveform equalization characteristic may be adjusted by a given amount in each of the periods of signal reproduction.

In yet another mode of the present invention, the waveform equalization characteristic may be adjusted by a first given amount in first given ones of the periods of signal reproduction, and be adjusted by a second given amount less than the first given amount in the rest of the periods of signal reproduction.

In yet another mode of the present invention, a discrete state in the distribution of the counted frequencies of the levels may be determined, and the waveform equalization characteristic may be adjusted so that the discrete state may match a discrete state of the distribution that should be obtained based on the given recording code.

Yet another object of the present invention is to provide a data reproduction control method and apparatus that realizes stable and more proper data reproduction even if a reproduced signal includes a steady distortion.

The above objects of the present invention are achieved by a data reproduction control method performing quantization on a signal reproduced from a recording medium recorded with data in accordance with a given recording code, and controlling a data reproduction characteristic at a time of determining, by a maximum likelihood detection process corresponding to the recording code, reproduced data from quantized data obtained by the quantization, wherein frequencies of levels of the quantized data are counted, and a processing characteristic in the maximum likelihood detection process is adjusted based on a distribution of the counted frequencies of the levels.

In another mode of the present invention, in the above-described data reproduction control method, the maximum likelihood detection process may be a Viterbi decoding algorithm, and expected values employed in the Viterbi decoding algorithm may be provided based on the distribution of the counted frequencies of the levels.

According to this data reproduction control method, even if a reproduced signal includes a steady distortion, an operation following a maximum likelihood detection process is performed with a processing characteristic matching the distortion. Therefore, even if the reproduced signal includes a distortion, stable and more proper data reproduction can be realized.

In yet another mode of the present invention, in the above-described data reproduction control method, a trailing edge of the reproduced signal may be detected based on a level change of the quantized data, the frequencies of the levels of the quantized data may be counted at the detected trailing edge of the reproduced signal, and the processing characteristic in the maximum likelihood detection process for the trailing edge of the reproduced signal may be adjusted based on the distribution of the counted frequencies of the levels.

In yet another mode of the present invention, in the above-described data reproduction control method, a rising edge of the reproduced signal may be detected based on a level change of the quantized data, the frequencies of the levels of the quantized data may be counted at the detected rising edge of the reproduced signal, and the processing characteristic in the maximum likelihood detection process for the rising edge of the reproduced signal may be adjusted based on the distribution of the counted frequencies of the levels.

According to these data reproduction control methods, when a reproduced signal includes a distortion especially at its trailing or rising edge due to a characteristic of a recording medium, a processing characteristic in a maximum likelihood detection process for the edge is individually adjustable.

The above objects of the present invention are also achieved by a data reproduction control apparatus performing quantization on a signal reproduced from a recording medium recorded with data in accordance with a given recording code, and controlling a data reproduction characteristic when maximum likelihood detection means, in accordance with a maximum likelihood detection process corresponding to the recording code, determines reproduced data from quantized data obtained by the quantization, which data reproduction control apparatus includes counting means for counting frequencies of levels of the quantized data, and characteristic adjustment means for adjusting a processing characteristic in the maximum likelihood detection means based on a distribution of the frequencies of the levels obtained in the counting means.

In another mode of the present invention, in the above-described data reproduction control apparatus, the maximum likelihood detection means may be Viterbi detection means by which the reproduced data is determined in accordance with a Viterbi decoding algorithm, and the characteristic adjustment means may include expected value setting means for setting expected values employed in the Viterbi detection means based on the distribution of the counted frequencies of the levels.

In yet another mode of the present invention, the above-described data reproduction control apparatus may include trailing edge detection means for detecting a trailing edge of the reproduced signal based on a level change of the quantized data, and counting control means for enabling the counting means while the trailing edge detection means detects the trailing edge of the reproduced signal, wherein the characteristic adjustment means may adjust the processing characteristic in the maximum likelihood detection means for the trailing edge of the reproduced signal based on the distribution of the frequencies of the levels obtained in the enabled counting means.

In yet another mode of the present invention, the above-described data reproduction control apparatus may include rising edge detection means for detecting a rising edge of the reproduced signal based on a level change of the quantized data, and counting control means for enabling the counting means while the rising edge detection means detects the rising edge of the reproduced signal, wherein the characteristic adjustment means may adjust the processing characteristic in the maximum likelihood detection means for the rising edge of the reproduced signal based on the distribution of the frequencies of the levels obtained in the enabled counting means.

Yet another object of the present invention is to provide an optical disk unit that operates in accordance with the above-described data reproduction control methods.

The above object of the present invention is achieved by an optical disk unit having a reproduction system including processing means for performing quantization and waveform equalization on a signal reproduced from an optical disk medium recorded with data in accordance with a given recording code, and maximum likelihood detection means for determining, in accordance with a maximum likelihood detection process corresponding to the recording code, reproduced data from waveform-equalized quantized data obtained in the processing means, which optical disk unit includes counting means for counting frequencies of levels of the quantized data, and equalization characteristic adjustment means for adjusting a waveform equalization characteristic in the waveform equalization so that a distribution of the frequencies of the levels obtained in the counting means approaches a distribution that should be obtained based on the given recording code.

The above object of the present invention is also achieved by an optical disk unit having a reproduction system including quantization means for performing quantization on a signal reproduced from an optical disk medium recorded with data in accordance with a given recording code, and maximum likelihood detection means for determining, in accordance with a maximum likelihood detection process corresponding to the recording code, reproduced data from quantized data obtained in said quantization means, which optical disk unit includes counting means for counting frequencies of levels of the quantized data, and characteristic adjustment means for adjusting a processing characteristic in the maximum likelihood detection means based on a distribution of the frequencies of the levels obtained in the counting means.

BRIEF DESCRIPTION OF THE DRAWINGS

Other objects, features and advantages of the present invention will become more apparent from the following detailed description when read in conjunction with the accompanying drawings.

FIG. 39 is a diagram showing an expected value setting; and

FIG. 40 is a diagram showing a structure of a Viterbi detector.

BEST MODE FOR CARRYING OUT THE INVENTION

Next, a description will be given, with reference to the drawings, of embodiments of the present invention.

Figure 1:
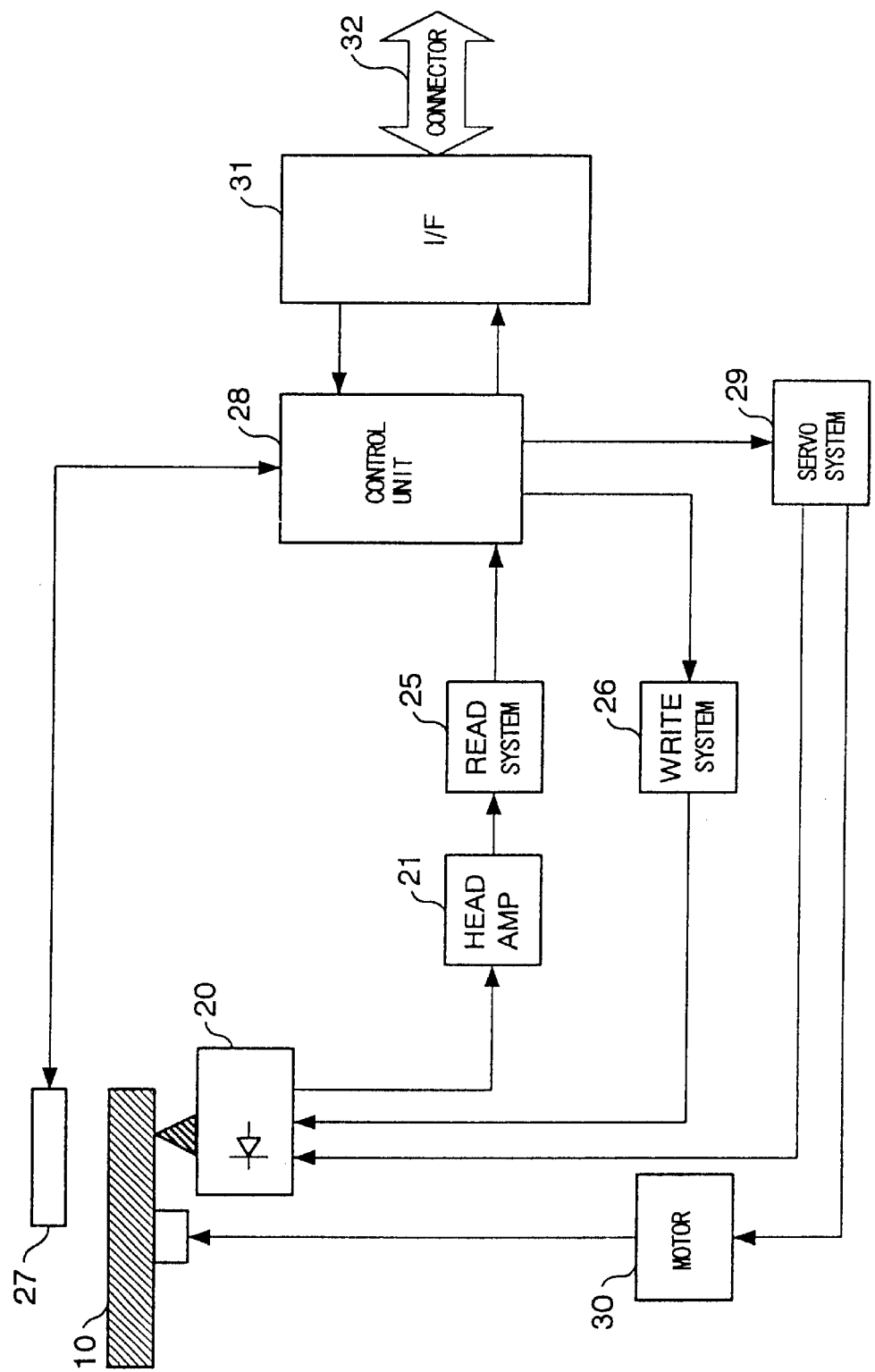
FIG. 1 is a block diagram showing a structure of a magneto-optical disk to which a reproduced signal control method and apparatus according to an embodiment of the present invention are applied.

An optical disk unit according to an embodiment of the present invention has a structure shown in FIG. 1. This optical disk unit is a magneto-optical disk unit that employs a magneto-optical disk as a recording medium.

In FIG. 1, this magneto-optical disk unit includes a magneto-optical disk 10 that serves as a recording medium, an optical head 20, an amplifier 21, a read system unit 25, a write system unit 26, an electromagnet 27, a control unit 28, a servo system unit 29, and a motor 30. Data is recorded on the magneto-optical disk 10 in accordance with a predetermined recording code (for instance, partial response PR(1, 1) of a constraint length 2), and data is read out from the magneto-optical disk 10.

The control unit 28 controls the read system unit 25, the write system unit 26, and the servo system unit 29 in accordance with read-data and write-data commands supplied via a connector 32 and an interface circuit 31 from an external unit. When the read-data command is supplied, the optical head optically scans the magneto-optical disk 10 to output a reproduced signal, which is supplied via the amplifier 21 to the read system unit 25. The read system unit 25 quantizes the supplied reproduced signal and generates output data in accordance with a maximum likelihood (ML) decoding algorithm (for instance, the Viterbi decoding algorithm). The output data is supplied to the control unit 28 and is output therefrom to the external unit via the interface circuit 31 and the connector 32.

When the control unit 28 receives the write command together with recording data, the control unit 28 modulates the recording data in accordance with the predetermined recording code (for instance, partial response PR(1, 1)), and supplies the modulated data to the write system unit 26. The write system unit 26 controls the optical head 20 in accordance with the supplied data, and further controls the electromagnet 27 based on data obtained from the modulation of the recording data. As a result, the data is written to the magneto-optical disk 10 in accordance with the above-described predetermined recording code.

The servo system unit 29 controlled by the control unit 28 drives the motor 30 to rotate the magneto-optical disk 10 at a predetermined speed, and places the optical head 20 in a recording or reproduction position on the magneto-optical disk 10.

Figure 2:
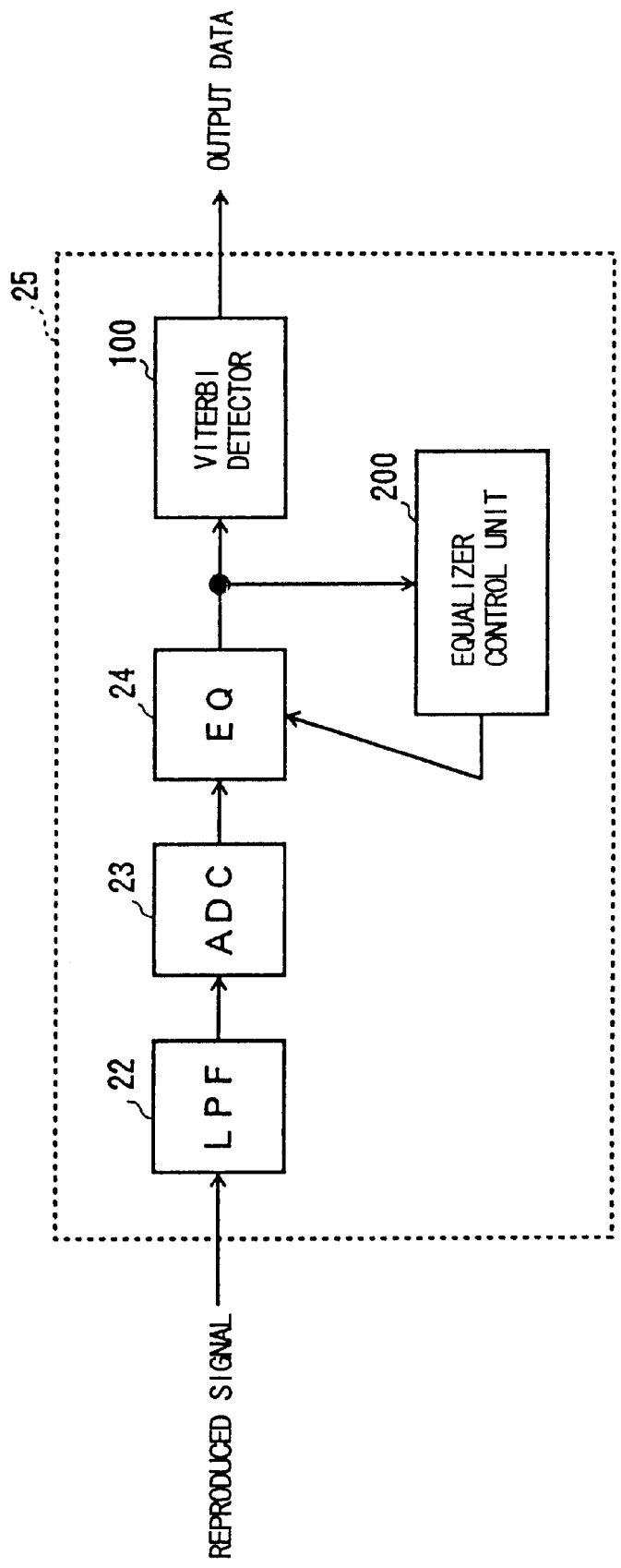
FIG. 2 is a diagram showing a structure of a read system.

The above-described read system unit 25 has a structure shown in FIG. 2.

In FIG. 2, the read system unit 25, includes a low-pass filter (LPF) 22, an analog-to-digital converter (ADC) 23, a digital equalizer (EQ) 24, a Viterbi detector 100, and an equalizer control unit 200. The reproduced signal amplified by the amplifier 21 (see FIG. 1) is waveform-shaped by the low-pass filter (LPF) 22. The analog-to-digital converter (ADC) 23 synchronizes the waveform-shaped reproduced signal with a given clock (not shown) and converts the reproduced signal into a digital signal. That is, the reproduced signal is quantized by being sampled in synchronism with a clock signal.

A sampled value supplied from the analog-to-digital converter (ADC) 23 is waveform-equalized by the digital equalizer (EQ) 24 to be output as equalized output data (quantized data). The equalized output data supplied from the digital equalizer (EQ) 24 is supplied to the Viterbi detector 100 in synchronism with the above-described clock signal. The Viterbi detector 100 detects recorded data in accordance with the Viterbi decoding algorithm from the equalized output data sequentially supplied in synchronism with the clock signal, and outputs the recorded data as reproduced data.

The output of the digital equalizer 24 is connected to the equalizer control unit 200. The equalizer control unit 200 controls the equalization characteristic of the digital equalizer 24 based on the state of the equalized output data sequentially output from the digital equalizer 24 at a time of, for instance, reproducing a signal from the magneto-optical disk 10 in an adjustment mode.

Figure 3:
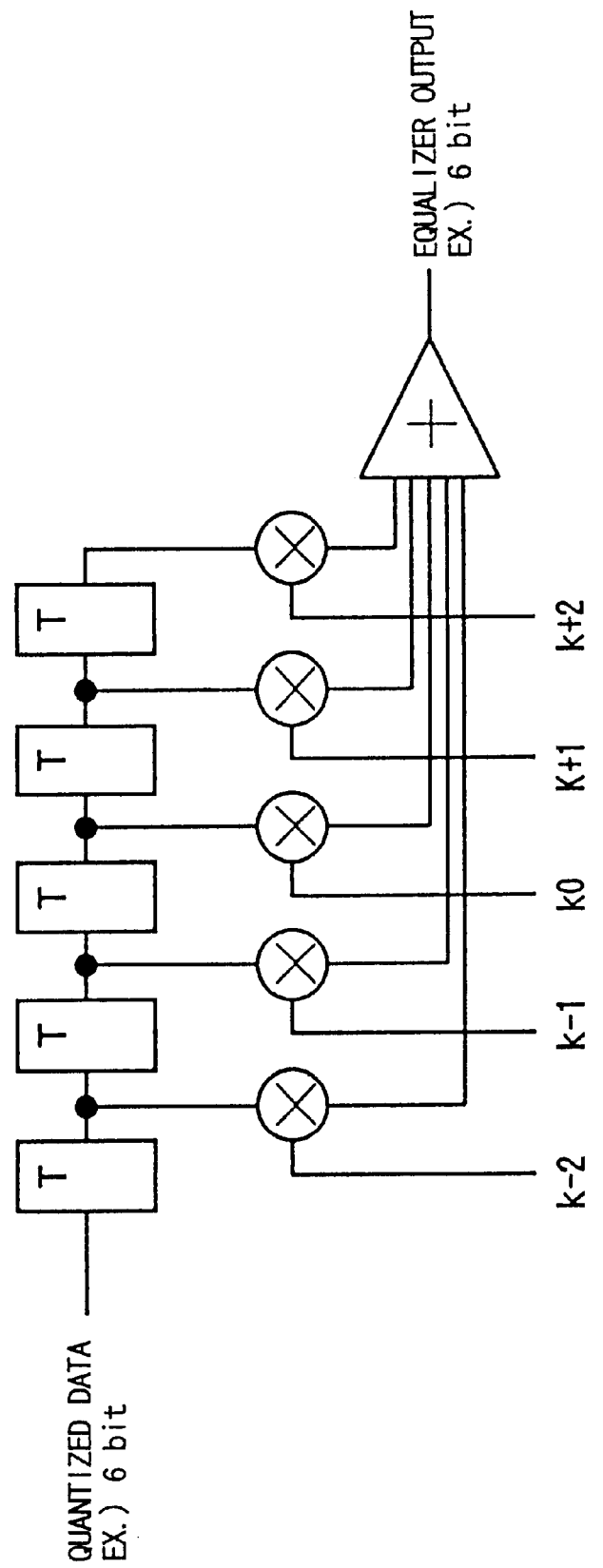
FIG. 3 is a diagram showing a structure of a digital equalizer.

The digital equalizer 24 is formed of a transversal filter shown in FIG. 3. That is, the digital equalizer 24 includes a series of five cascaded delay elements (registers) T, and adds up (+) values obtained by multiplying the outputs of the delay elements by tap coefficients k−1, k−2, k0, k+1, and k+2, respectively. The equalization characteristic of the digital equalizer 24 can be controlled by adjusting the tap coefficients k−1, k−2, k0, k+1, and k+2.

Figure 4:
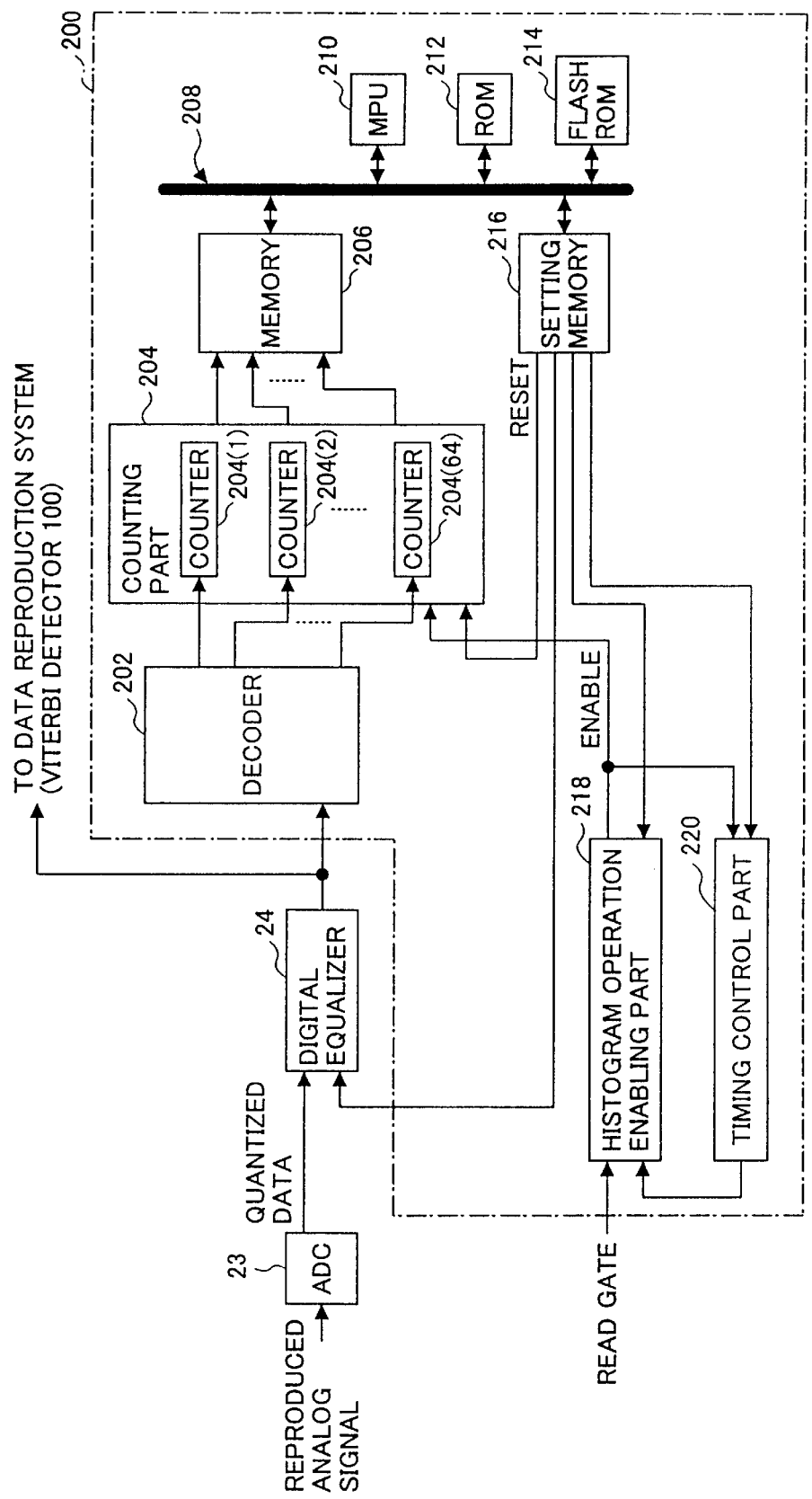
FIG. 4 is a block diagram showing a detailed structure of an equalizer control unit shown in FIG. 2.
Figure 5:
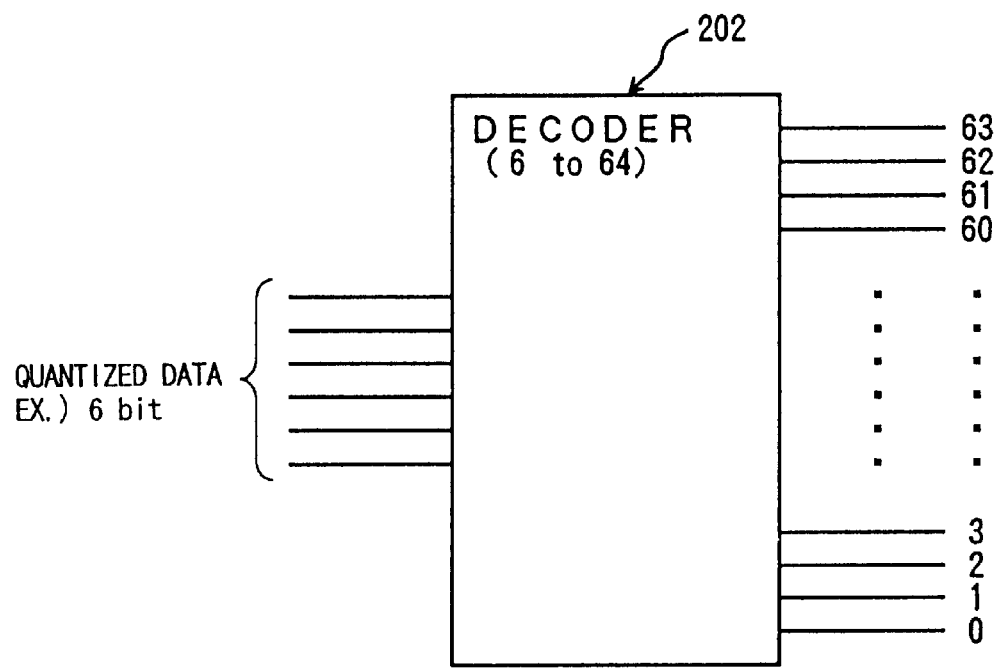
FIG. 5 is a diagram showing a structure of a decoder of the equalizer control unit.

The equalizer control unit 200 has a structure shown in FIG. 4.

In FIG. 4, the equalizer control unit 200 includes a decoder 202, a counting part 204, a histogram memory 206, an MPU 210, a ROM 212, a nonvolatile memory 214 (for instance, a flash ROM), a setting memory 216, a histogram operation enabling part 218, and a timing control part 220. The MPU 210, ROM 212, nonvolatile memory 214, histogram memory 206, and setting memory 216 are connected by a bus 208 (including a data bus, an address bus, and a control line).

The MPU 210 controls the whole equalizer control unit 200 and performs a later-described determination operation of the tap coefficients of the digital equalizer 24 in accordance with programs stored in the ROM 212. The nonvolatile memory 214 retains the values of the tap coefficients k−1, k−2, k0, k+1, and k+2 determined by the tap coefficient determination operation of the MPU 210. The setting memory 216, based on a command supplied from the MPU 210, stores set values used in the tap coefficient determination operation and the tap coefficients to be supplied to the digital equalizer 24. The setting memory 216 also stores reset information (reset) to the counting part 204.

The decoder 202 classifies the equalized output data from the digital equalizer 24 by level. In this case, the analog-to-digital converter (ADC) 23 outputs the 6-bit quantized data, and the digital equalizer 24 also outputs the 6-bit equalized output data. The decoder 202 to which such equalized output data is input includes a decoder that decodes a 6-bit input into a 64-bit output. That is, each output bit of the decoder 202 corresponds to any of 64 (0 through 63) levels represented by the 6-bit equalized output data (64 classifications).

Figure 6:
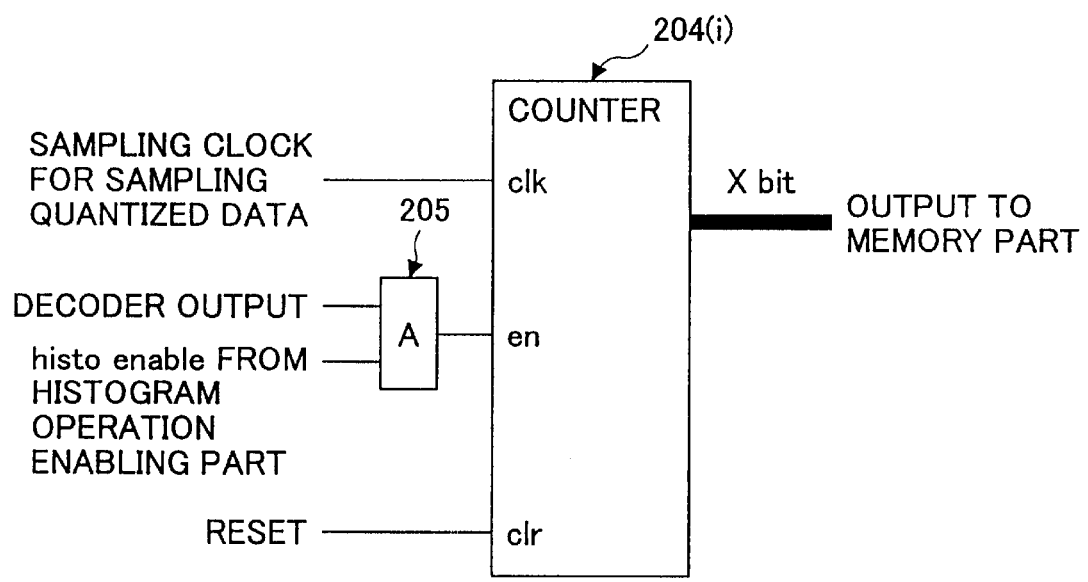
FIG. 6 is a diagram showing a structure of each counter in a counting part of the equalizer control unit.

The counting part 204 includes 64 counters 204(1) through 204(64) each connected with a corresponding one of the output bits of the decoder 202. Each counter 204($i$) ($i$=1, 2, ..., 64) has a structure shown in FIG. 6. That is, each counter 204(i) includes a clock terminal (clk), an enabling terminal (en), and a CLEAR terminal (clr), and counts clock pulses input to the clock terminal (clk) when the enabling terminal (en) is in an enabled state (for instance, HIGH).

The synchronizing clock signal supplied to the analog-to-digital converter (ADC) 23 quantizing the above-described reproduced signal is input to the clock terminal (clk), and a corresponding output bit signal from the decoder 202 is input to the enabling terminal (en) via an AND element 205 that is set to an enabled state by an enabling signal (histo enable) output from the histogram operation enabling part 218 as described later. A reset signal based on the above-described reset information stored in the setting memory 216 is input to the CLEAR terminal (clr).

Since the equalized output data is input to the decoder 202 from the digital equalizer 24 in synchronism with the above-described synchronizing signal, each counter 204(i) having the above-described structure counts the frequency of the corresponding level of the equalized output data.

The count value of each counter 204(i) of the counting part 204 is supplied to the histogram memory 206. As a result, the histogram memory 206 stores the frequency of each of the levels (0 through 63) of the equalized output data.

The output bit number X of each counter 204(i) determines the maximum value of the frequency of each corresponding classified level.

Figure 7:
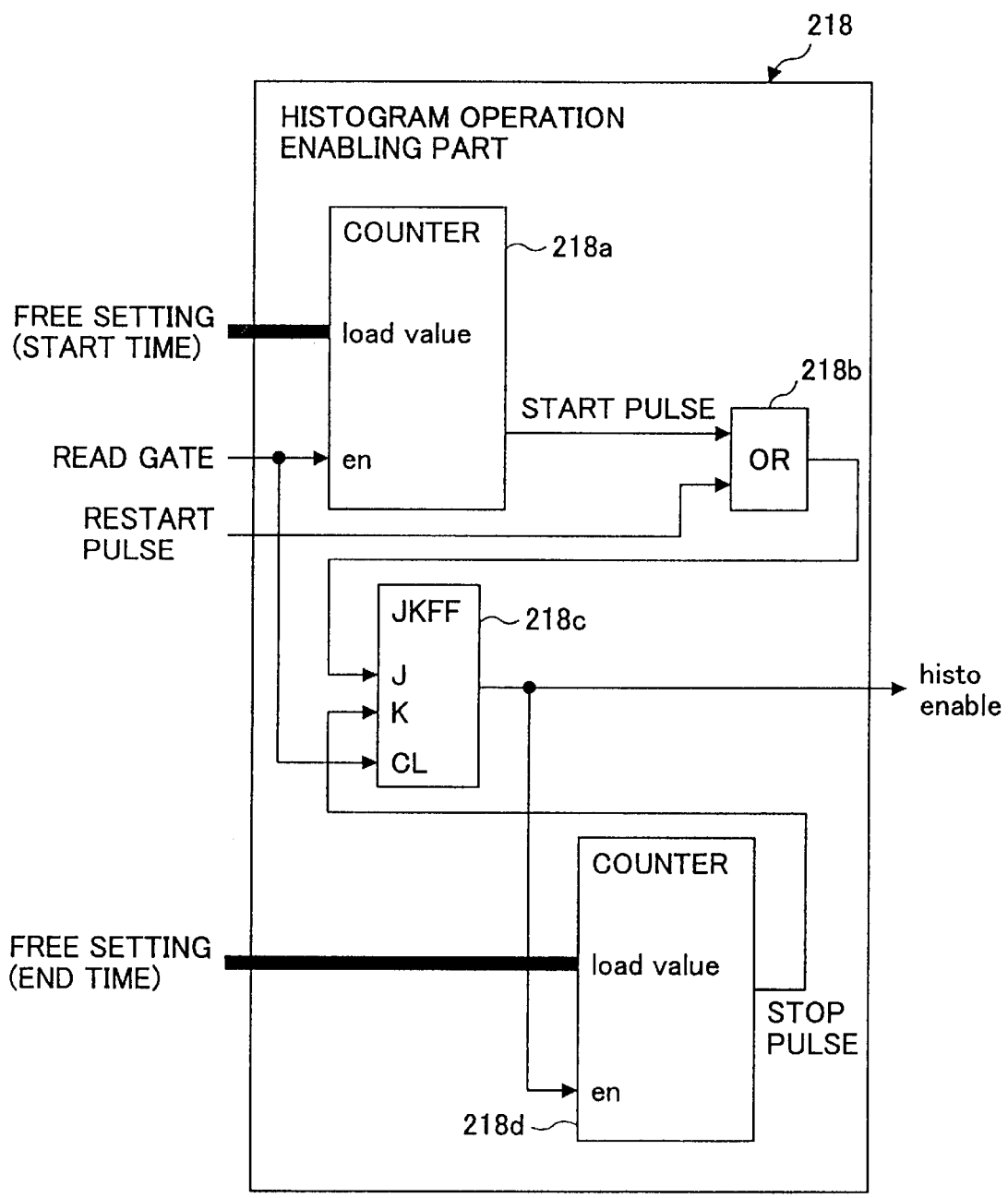
FIG. 7 is a block diagram showing a detailed structure of a histogram operation enabling part of the equalizer control unit.

The histogram operation enabling part 218 generates the enabling signal (histo enable) for enabling a count operation (histogram creation operation) in the counting part 204 based on the set values stored in the setting memory 216 and a timing signal (restart pulse) supplied from the timing control part 220. The histogram operation enabling part 218 has a structure shown in FIG. 7. In FIG. 7, the histogram operation enabling part 218 includes a first counter 218a for detecting an upper limit value, an OR element 218b, a flip-flop (JK-FF) 218c, and a second counter 218d for detecting an upper limit value. Although a clock terminal is omitted for simplification purposes, clock pulses are supplied to the counters and the flip-flop.

The first counter 218a includes a load value terminal (load) for setting the upper limit value and an enabling terminal (en). A start count value corresponding to a start time of the above-described histogram creation operation is input to the load value terminal (load). The start count value is processed in the MPU 210 to be stored in the setting memory 216, and is supplied therefrom to the first counter 218a. A read-enabling signal (read gate) that is made valid at a time of reading data from the magneto-optical disk 10 is input to the enabling terminal (en). The first counter 218a starts performing a count operation on a predetermined clock signal, which may be the same as the clock signal used for sampling the reproduced signal, from a data read start time, and outputs a start pulse when its count value reaches the start count value.

The flip-flop (JK-FF) 218c includes J and K terminals, and a CLEAR terminal (CL). The start pulse supplied from the first counter 218c is input to the J terminal via the OR element 218b, and the read-enabling signal (read gate) is input to the CLEAR terminal (CL). A stop pulse, which is the output of the second counter 218d, is input to the K terminal. By the above-described structure, when the read-enabling signal (read gate) is made valid (when the data readout starts), the enabling signal (histo enable) that is valid from the output of the start pulse from the first counter 218a to the output of the stop pulse from the second counter 218d is output from the flip-flop (JK-FF) 218c.

The second counter 218d also includes a load value terminal (load) for setting the upper limit value and an enabling terminal (en). A stop count value corresponding to an end time of the above-described histogram creation operation is input to the load value terminal (load). The stop count value is also processed in the MPU 210 to be stored in the setting memory 216, and is supplied therefrom to the second counter 218d. The enabling signal (histo enable) supplied from the flip-flop (JK-FF) 218c is input to the enabling terminal (en). The second counter 218d starts performing a count operation on a predetermined clock signal, which may be the same as the clock signal used for sampling the reproduced signal, after the enabling signal (en) for enabling the count operation (histogram creation operation) in the counting part 204 is made valid, and outputs a stop pulse when its count value reaches the end count value.

Thus, the histogram operation enabling part 218 having the above-described structure outputs the enabling signal (histo enable) that is valid from the start time corresponding to the start count value to the end time corresponding to the end count value.

Figure 8:
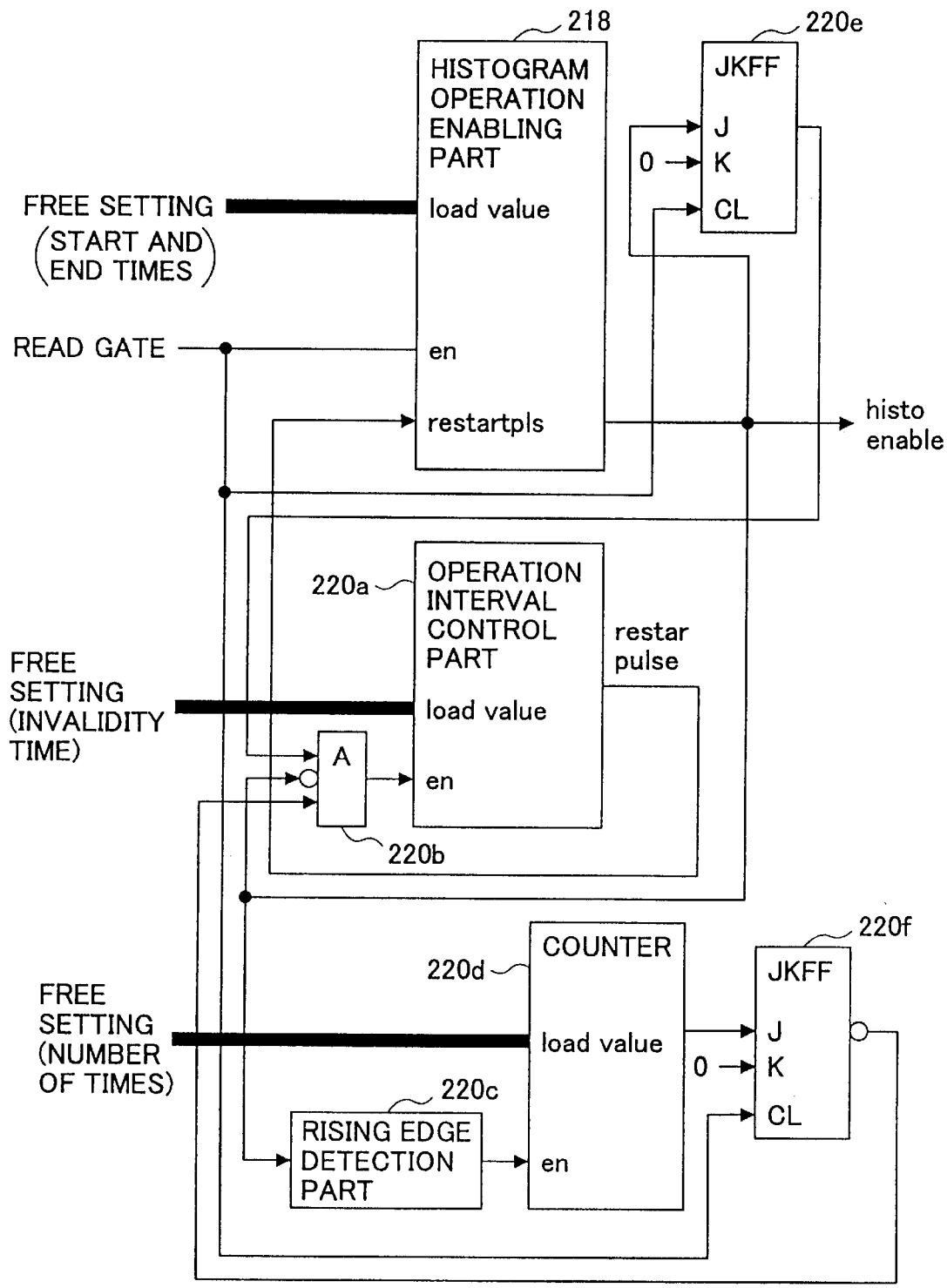
FIG. 8 is a diagram showing a detailed structure of a timing control part of the equalizer control unit.

The timing control part 220 supplying the restart pulse to the histogram operation enabling part 218 has a structure shown in FIG. 8. In FIG. 8, the timing control part 220 includes an operation interval control part 220a, an AND element 220b, a rising edge detection part 220c, a counter 220d for detecting an upper limit, a first flip-flop (JK-FF) 220e, and a second flip-flop (JK-FF) 220f. A clock terminal is also omitted in FIG. 8 for simplification purposes as in FIG. 7.

The first flip-flop (JK-FF) 220e includes J and K terminals, and a CLEAR terminal (CL). The enabling signal (histo enable) supplied from the histogram operation enabling part 218 is input to the J terminal, which is always maintained at a LOW level ("0"). The read-enabling signal (read gate) is input to the CLEAR terminal (CL). By this structure, the first flip-flop (JK-FF) 220e outputs a first control signal that is valid from when the enabling signal (histo enable) is made valid for the first time to when the read-enabling signal (read gate) is made invalid.

The operation interval control part 220a has a counter function, and outputs a pulse signal when its count value reaches a set upper limit value. The operation interval control part 220a includes a load value terminal (load) for setting the upper limit value and an enabling terminal (en). The inverted signal of the enabling signal (histo enable) supplied from the histogram operation enabling part 218 is input to the enabling terminal (en) via the AND element 220b controlled by the first control signal supplied from the first flip-flop (JK-FF) 220e and a second control signal supplied, as described later, from the second flip-flop (JK-FF) 220f. An invalidity count value corresponding to a time to stop the histogram creation operation (an invalidity time) is input to the load value terminal. This invalidity count value is processed in the MPU 210 to be stored in the setting memory 216, and is supplied therefrom to the operation interval control part 220a. The operation interval control part 220a starts performing a count operation on a predetermined clock signal, which may be the same as the clock signal used for sampling the reproduced signal, after the enabling signal (histo enable) supplied from the histogram operation enabling part 218 is made invalid (or the inverted signal is made valid), and outputs the above-mentioned pulse, that is, a restart pulse, when its count value reaches the invalidity count value. The restart pulse is supplied to the histogram operation enabling part 218.

Back in FIG. 7, in the histogram operation enabling part 218, this restart pulse is supplied via the OR element 218b to the J terminal of the flip-flop (JK-FF) 218c to make the enabling signal (histo enable) valid just as the start signal.

Therefore, by the above-described structure, after a given period of time (corresponding to the invalidity count value) passes since the enabling signal (histo enable) made valid by the start pulse is made invalid by the stop signal, the enabling signal (histo enable) is made valid again by the restart pulse.

In FIG. 8, the rising edge detection part 220c detects a rising edge of the enabling signal (histo enable) supplied from the histogram operation enabling part 218 to output a rising edge detection signal. The counter 220d includes a load value terminal (load) and an enabling terminal (en). The number of times the histogram creation operation is performed is input to the load value terminal (load). This number of times is processed in the MPU 210 to be stored in the setting memory 216, and is supplied therefrom to the counter 220d. The counter 220d counts the detection pulses supplied from the rising edge detection part 220c, and outputs an end signal when its count value reaches the set number of times.

The flip-flop (JK-FF) 220f includes J and K terminals and a CLEAR terminal (CL). The end signal supplied from the counter 220d is input to the J terminal, and the K terminal is always maintained at a LOW level ("0"). The read-enabling signal (read gate) is input to the CLEAR terminal (CL). By this structure, when the read-enabling signal (read gate) is made valid, the flip-flop (JK-FF) 220f is enabled to output the above-mentioned second control signal that is made valid (Low) when the end signal is input and is made invalid (High) when the read-enabling signal (read gate) is made invalid. (In the drawing, a circle put by a gate represents logic inversion.) As previously described, the second control signal is supplied to the AND element 220b as a gate control signal.

Figure 9:
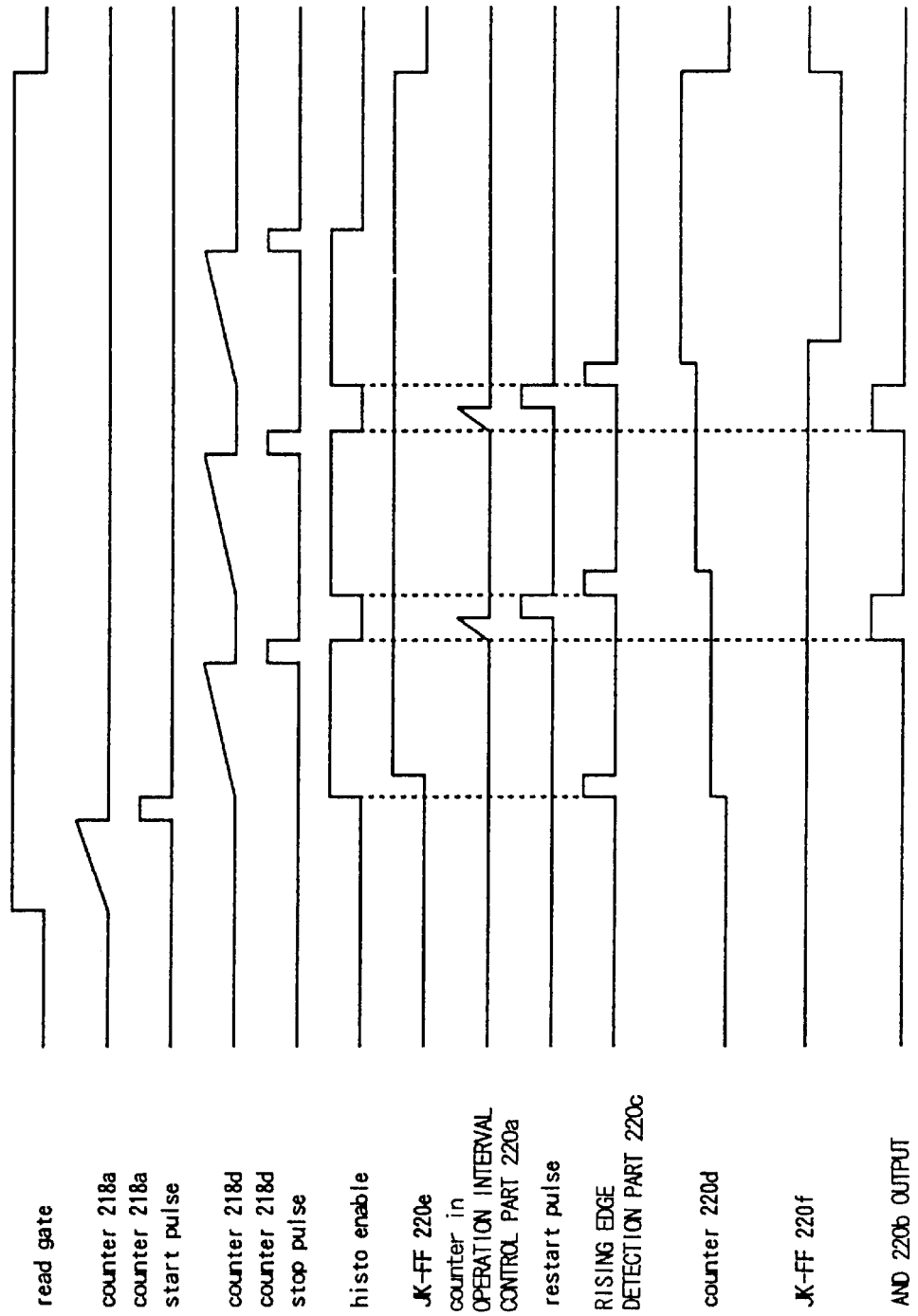
FIG. 9 is a timing chart showing a signal state of each part in the histogram operation enabling part and the timing control part of the equalizer control unit.

The signals in the histogram operation enabling part 218 and the timing control part 220 vary as shown in FIG. 9. In FIG. 9, when the read-enabling signal (read gate) is made valid to perform reading of the magneto-optical disk 10, the first counter 218a of the histogram operation enabling part 218 starts a count operation. When its count value reaches the start count value, the start pulse is output from the first counter 218a to make valid the enabling signal (histo enable). When the enabling signal (histo enable) is made valid, the second counter 218d starts a count operation. When its count value reaches the end count value, the stop pulse is output from the second counter 218d to make invalid the enabling signal (histo enable).

Thereafter, the counter of the operation interval control part 220a of the timing control part 220 starts a count operation. When its count value reaches the invalidity count value, the restart pulse is output from the operation interval control part 220a to make valid the enabling signal (histo enable) supplied from the histogram operation enabling part 218. Similarly, thereafter, when the count value of the second counter 218d that starts the count operation when the enabling signal (histo enable) reaches the end count value, the stop pulse makes the enabling signal (histo enable) invalid. When the count value of the counter of the operation interval control part 220a that starts the count operation when the enabling signal (histo enable) is made invalid reaches the invalidity count value, the restart pulse again makes valid the enabling signal (histo enable). When the number of times the enabling signal (histo enable) is made valid reaches the set number of times in process of repeating such operations, the second control signal output from the flip-flop (JK-FF) 220f of the timing control part 220 is made valid (Low) to inhibit the operation interval control part 220a from outputting the restart pulse.

By the above-described process, while the read-enabling signal (read gate) is valid, the enabling signal (histo enable) having a set time width (determined by the start and end count values) is output from the histogram operation enabling part 218 for the set number of times at regular intervals (determined by the invalidity count value).

Every time the enabling signal that is made valid as described above is supplied to the counting part 204 during signal reproduction from the magneto-optical disk 10, the frequency of each of the levels of the equalized output data output from the digital equalizer 24 is counted by a corresponding one of the counters 204(1) through 204(64) of the counting part 204. The count values of the counters 204(1) through 204(64) are stored in the histogram memory 206 as a histogram of the frequencies of the levels.

Figure 10:
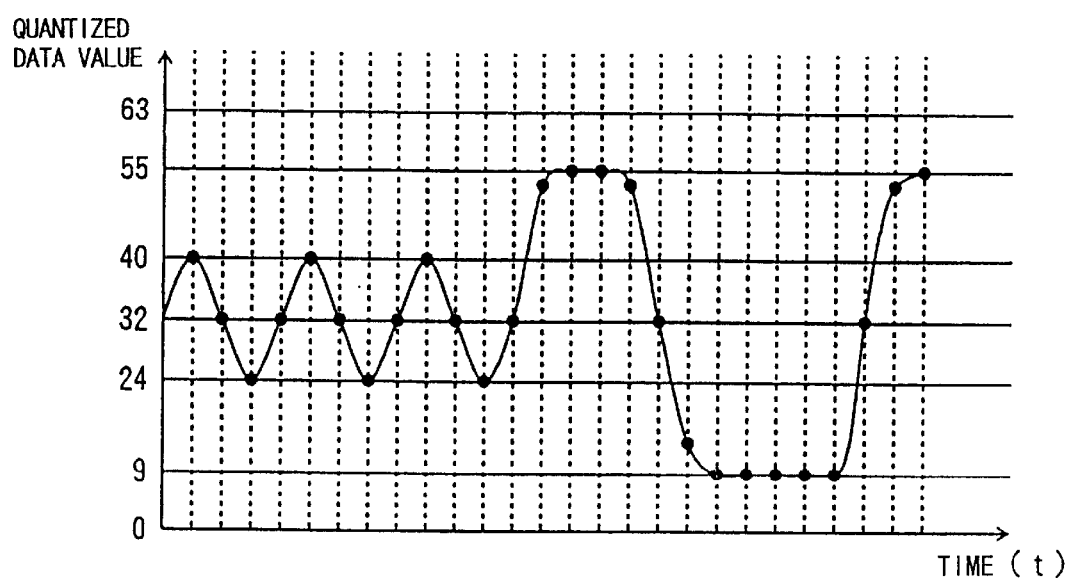
FIG. 10 is a diagram showing a reproduced signal.
Figure 11:
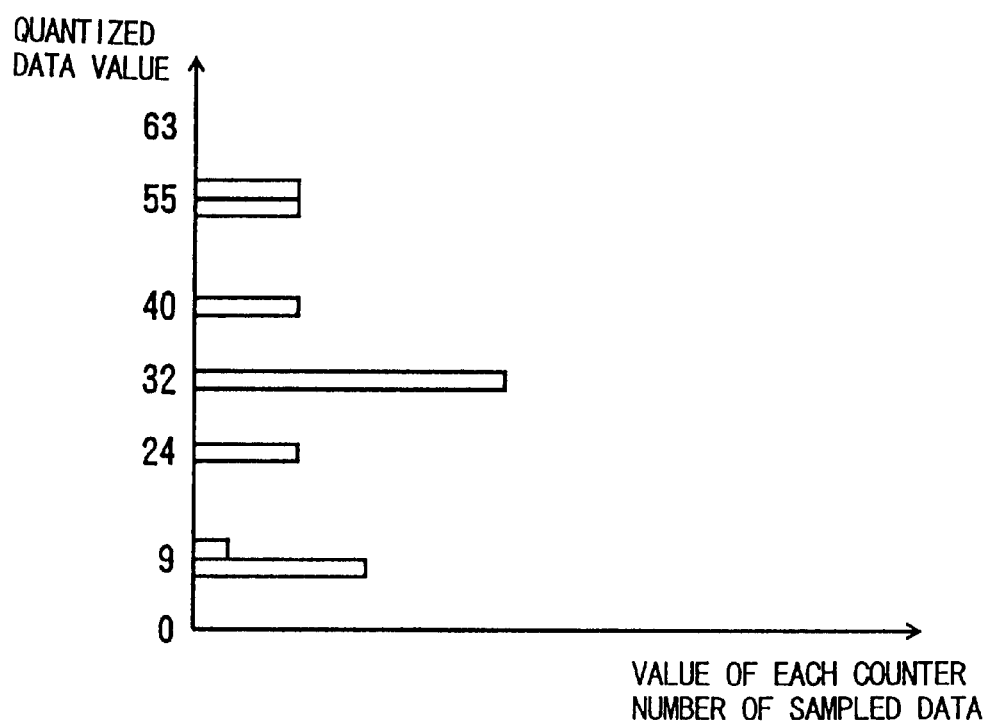
FIG. 11 is a diagram showing a histogram of sampled values of the reproduced signal shown in FIG. 10.

Since, in this embodiment, the data is recorded on the magneto-optical disk 10 in accordance with a PR(1, 1) waveform of the constraint length 2, data to be reproduced (expected values) takes three values of 1, 0, and −1 (or 0, 1, and 2). If the reproduced signal (output of the low-pass filter (LPF) 22 in FIG. 2), for instance, varies to draw a curve shown in FIG. 10, the frequencies of the levels of the equalized output data from the digital equalizer 24 corresponding to data quantized in the analog-to-digital converter 23 at clock timings (indicated by broken lines) are as shown in FIG. 11. The frequencies of the levels of the equalized output data are stored in the histogram memory 206 as a histogram. In this case, although equalized output data of levels corresponding to three expected values should have been detected, the frequencies of the levels of the actual detected equalized output data do not correspond to a discrete distribution of three discrete values (wherein the number of discrete values is 3). Therefore, the recorded data cannot be reproduced accurately from the equalized output data of such a state by the Viterbi detector 100.

Figure 12:
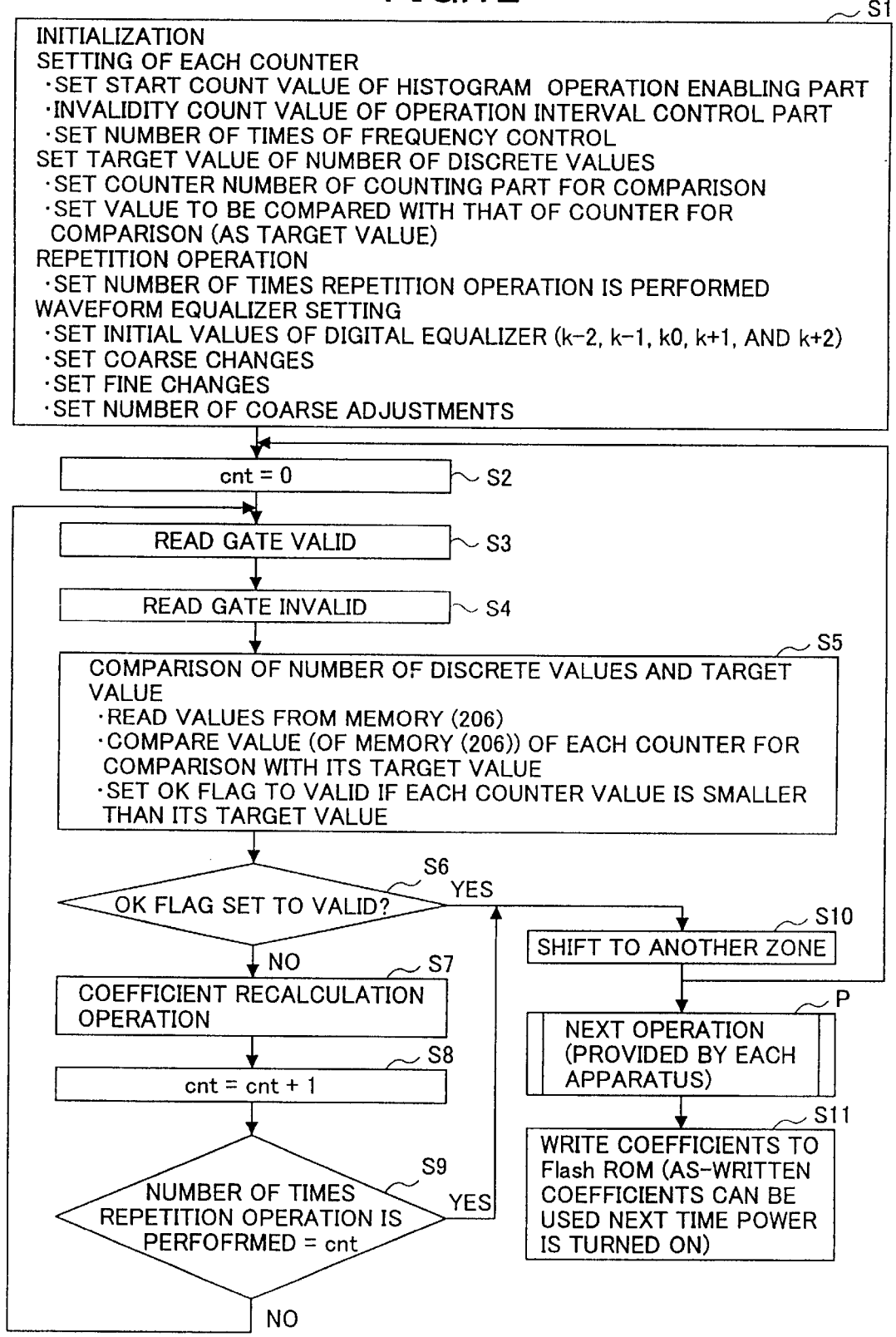
FIG. 12 is a flowchart showing steps of an adjustment operation of tap coefficients of the digital equalizer.
Figure 13:
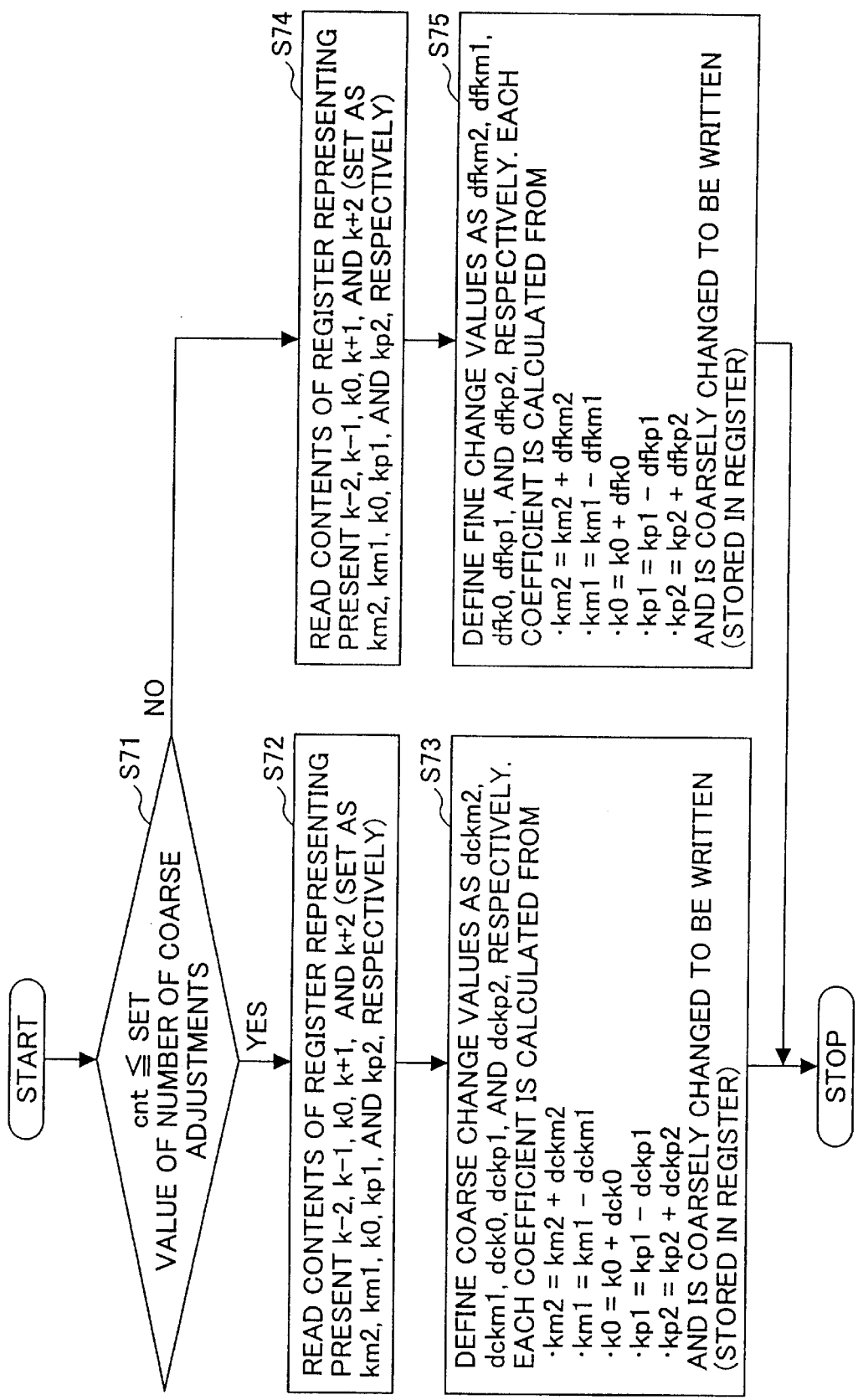
FIG. 13 is a flowchart showing detailed, steps of a recalculation operation of the tap coefficients in the operation of FIG. 12.

Thus, the MPU 210 controls the tap coefficients of the digital equalizer 24 by steps shown in FIGS. 12 and 13.

This operation may be performed by reading out test data prerecorded on the magneto-optical disk 10, or by reading out data recorded on the magneto-optical disk 10 as necessary data. Further, this operation may be performed at regular intervals when the power is turned on, a read error is detected, and the recording medium (the magneto-optical disk 10) is replaced with another.

In FIG. 12, initialization is performed (S1). In the initialization, a setting operation with respect to each counter, a setting operation with respect to a target value for determining whether the number of discrete values is proper, a setting operation with respect to a repetition operation, and a setting operation with respect to the digital equalizer (waveform equalizer) 24 are performed based on input information from a user. If values are set with respect to the necessary items as default values in the setting memory 216 and are not required to be modified, the initialization is not required for the items.

In the setting operation with respect to each counter, set are the start count value corresponding to the start time of the histogram creation operation, the end count value corresponding to the end time of the histogram creation operation, the invalidity count value corresponding to the interval of the histogram creation operation, and the number of times the histogram creation operation is performed. In the setting operation with respect to the target value for determining whether the number of discrete values is proper, set are a counter number and a reference value (target value) for determination to specify a counter of the counting part 204 whose count value is subjected to the determination.

In the setting operation with respect to the repetition operation, a histogram is created and the number of times the tap coefficients of the digital equalizer 24 are adjusted based on the histogram is set. In the setting operation with respect to the digital equalizer 24, set are the initial values of the tap coefficients k−2, k−1, 0, k+1, and k+2, coarse changes dckm2, dckm1, dck0, dckp1, and dckp2 in the tap coefficients, fine changes dfkm2 (<dckm2), dfkm1 (<dckm1), dfk0 (<dck0), dfkp1 (<dckp1), and dfkp2 (<dckp2) in the tap coefficients, and the number of times the tap coefficients are coarsely adjusted.

After the initialization (S1) is completed, an internal counter is reset (cnt=0) (S2), and the read-enabling signal (read gate) is made valid (S3). With the read-enabling signal (read gate) being thus made valid, a signal is reproduced from the magneto-optical disk 10. During the signal reproduction, based on the set values (start count value, end count value, invalidity count value, and the number of times) set by the initialization, the frequencies of the levels of the equalized output data from the digital equalizer 24 are counted for the set number of times at the regular intervals as previously described. The results are stored in the histogram memory 206 as a histogram.

After a given period of time passes, the read-enabling signal is made invalid (S4) and the signal reproduction from the magneto-optical disk 10 is terminated.

Next, based on the histogram of the frequencies of the levels of the equalized output data created in the above-described manner, a determination operation as to whether its number of discrete values is a proper value (S5) is performed. In this determination operation, the frequencies of the levels of the histogram are read out from the histogram memory 206. The frequency counted by the counter specified in the initialization is selected from the numbers, and is compared with the reference value (target value) set by the initialization.

For instance, in the case of a PR(1, 1) waveform, each peak value and a center value of a reproduced waveform are data to be taken, and therefore, correctly, levels between a reproduced signal and each of the peak values (positive and negative) are not to be taken. Therefore, as shown in FIGS. 10 and 11, set in a predetermined register as the frequencies subjected to the determination are the count value of a level 40 (cntr 40) between a center level 32 of the reproduced signal that varies from 0 to 63 in level and the maximum level 63 and the count value of a level 24 (cntr 24) between the center level 32 and the minimum level 0. Then, each of the count values (cntr 40 and cntr 24) is compared with, for instance, a reference value "1". If each of the count values (cntr 40 and cntr 24) is smaller than the reference value, it is determined that the number of discrete value (three in this case) is proper, and an OK flag is set to 1(VALID). On the other hand, if one of the count values (cntr 40 and cntr 24) is greater than the reference value "1", it is determined that the number of discrete values is not proper, and the OK flag is maintained to 0 (INVALID).

After the above-described determination operation is completed, it is determined whether the OK flag is set to VALID (S6). If the OK flag is not set to VALID, it is determined that the number of discrete values is not proper, and a recalculation operation of the tap coefficients of the digital equalizer 24 is performed (S7). A description of the recalculation operation of the tap coefficients will be given later. The tap coefficients stored in the setting memory 216 are replaced with values of the tap coefficients obtained by the recalculation operation. When the recalculation operation of the tap coefficients is completed, the internal counter is incremented (cnt=cnt +1) (S8), and it is determined whether a count value (cnt) of the internal counter reaches the number of repetitions set in the initialization (S9).

Here, if the count value (cnt) of the internal counter does not reach the number of repetitions, the read-enabling signal (read gate) is again made valid (S3). Then, the values of the tap coefficients k−2, k−1, k0, k+1, and k+2 of the digital equalizer 24 are replaced with the values of the tap coefficients stored in the setting memory 216. With the tap coefficients of the digital equalizer 24 being updated, the signal reproduction from the magneto-optical disk 10 is performed, and, as in the above-described manner, a histogram of the frequencies of the levels of the equalized output data from the digital equalizer 24.

The recalculation operation of the tap coefficients (S7) is performed in accordance with steps shown in FIG. 13.

In FIG. 13, it is determined whether the count value (cnt) of the internal counter is smaller than or equal to the value of the number of coarse adjustments set in the initialization (S71). If the count value (cnt) of the internal counter is smaller than or equal to the set value of the number of coarse adjustments, the values of the tap coefficients k−2, k−1, k0, k+1, and k+2 are read out from the setting memory 216 (S72). The values are taken as km2, km1, k0, kp1, and kp2, respectively. By using these values of the tap coefficients and the coarse changes dckm2, dckm1, dck0, dckp1, and dckp2 set in the initialization, new values of the tap coefficients are calculated based on the following expressions:

$$km2=km2+dckm2$$

$$km1=km1-dckm1.$$

$$k0=k0+dck0$$

$$kp1=kp1-dckp1$$

$$kp2=kp2+dckp2$$

The new values of the tap coefficients thus calculated are stored in the setting memory 216 so that the tap coefficients are updated.

As previously described, the values of the tap coefficients of the digital equalizer 24 are updated by the coarse changes so that a histogram of the frequencies of the levels of the equalized output data form the digital equalizer 24 is created, and the operations (S3, S4, S5, S6, S7, S8, and S9) including the determination as to whether the number of discrete values of the levels is proper are repeatedly performed. If it is determined in the recalculation operation of the tap coefficients (S7) that the count value (cnt) of the internal counter reaches the set value of the number of coarse adjustments (that is, if "NO" in step S71 of FIG. 13) before the number of discrete values becomes proper, the values km2, km1, k0, kp1, and kp2 of the tap coefficients k−2, k−1, k0, k+1, and k+2 stored in the setting memory 216 are read out (S74). By using these values of the tap coefficients and the fine changes dfkm2, dfkm1, dfk0, dfkp1, and dfkp2 set in the initialization, new values of the tap coefficients are calculated based on the following expressions:

$km2 = km2 + dfkm2$ $km1 = km1 - dfkm1$ $k0 = k0 + dfk0$ $kp1 = kp1 - dfkp1$ $kp2 = kp2 + dfkp2$ The new values of the tap coefficients thus calculated are stored in the setting memory 216 so that the tap coefficients are updated.

As previously described, the values of the tap coefficients of the digital equalizer 24 are updated by the fine changes so that a histogram of the frequencies of the levels of the equalized output data form the digital equalizer 24 is created, and the operations (S3, S4, S5, S6, S7, S8, and S9) including the determination as to whether the number of discrete values of the levels is proper are repeatedly performed. If the number of discrete values becomes proper during the process, the OK flag is set to VALID ("YES" in step S6) to shift a read area to another zone of the magneto-optical disk 10 (S10), and the same operations as described above (S2 through S9) are performed.

If the number of discrete values in the histogram of the frequencies of the levels of the equalized output data becomes proper in each of predetermined zones, the values of the tap coefficients of the digital equalizer 24 of each zone are stored in the nonvolatile memory 214 after a predetermined process (P: provided by each apparatus) is performed (S11).

The values of the tap coefficients stored in the nonvolatile memory 214 can be set in the digital equalizer 24 when the power is again turned on after a shut-off.

If, in the above-described process, the number of discrete values in the histogram of the frequencies of the levels of the equalized output data becomes proper before the count value (cnt) of the internal counter reaches the set value of the number of coarse adjustments, the values of the tap coefficients used in the calculation are stored in the nonvolatile memory 214 without the fine adjustment (steps S74 and S74 in FIG. 13). Further, if the count value (cnt) of the internal counter reaches the number of repetitions set in the initialization before the number of discrete values in the histogram of the frequencies of the levels of the equalized output data becomes proper, the values of the tap coefficients obtained at that point are stored in the nonvolatile memory 214. In that case, readjustment can be performed, letting the values of the tap coefficients stored in the nonvolatile memory 214 be the initial values.

Data reproduction is normally performed with the tap coefficients of the digital equalizer 24 being set to values adjusted by the above-described operation. In this case, its equalized output data is detected at levels closer to those at which the equalized output data is to be detected correctly. As a result, the recorded data is reproduced from the equalized output data of such a state by the Viterbi detector 100 so that more accurate reproduced data can be obtained.

Figure 14:
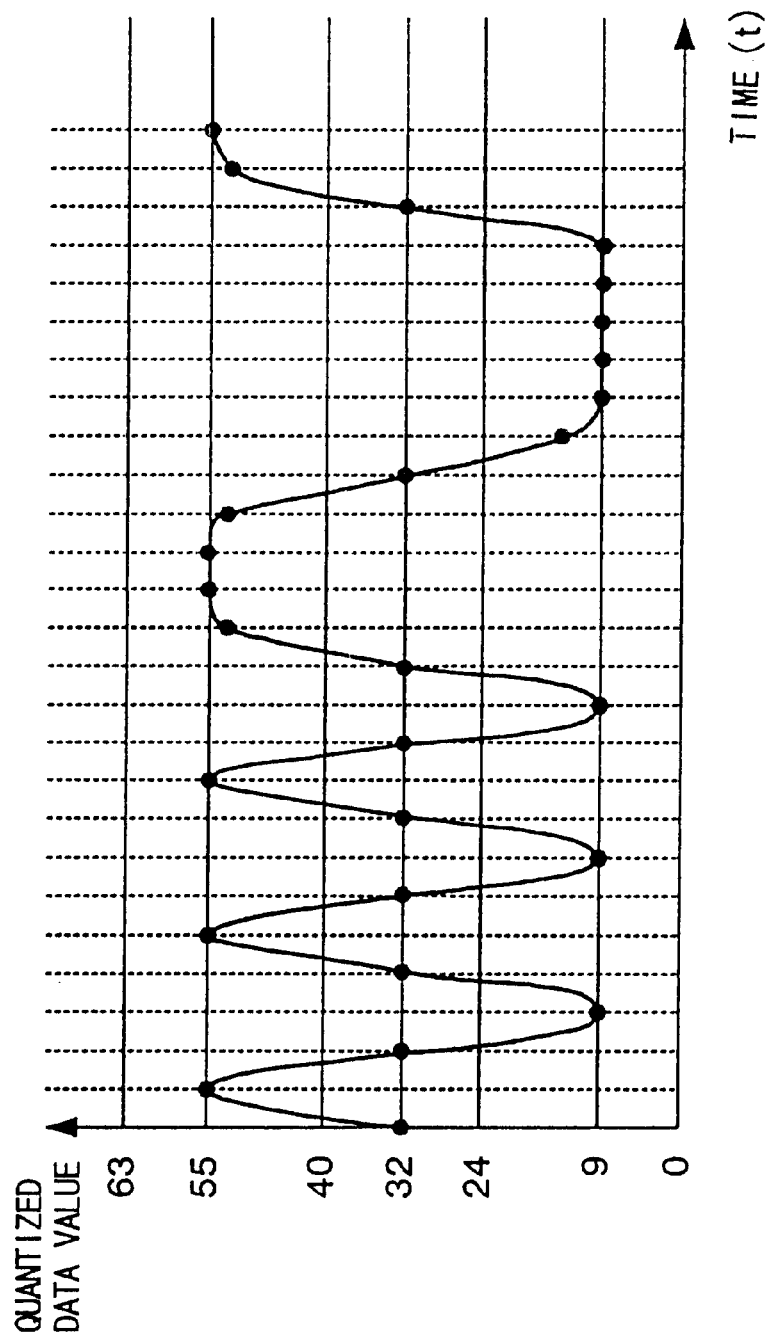
FIG. 14 is a diagram showing another example of the reproduced signal.
Figure 15:
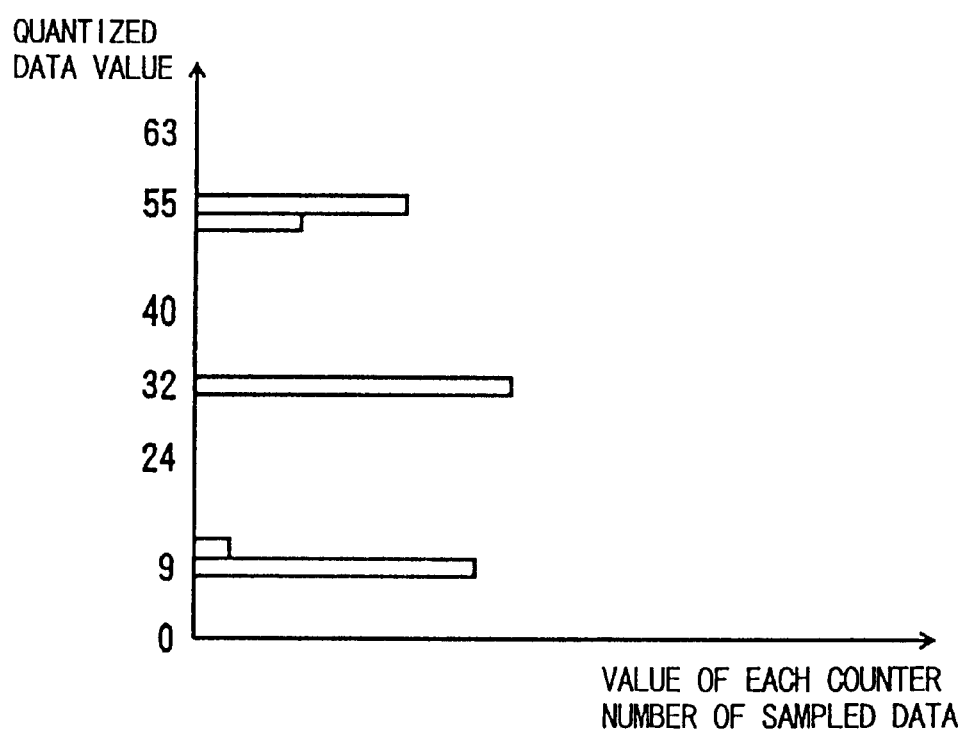
FIG. 15 is a diagram showing a histogram of sampled values of the reproduced signal shown in FIG. 14.

For instance, the equalized output data obtained by reproducing a recorded signal of a PR(1, 1) waveform and varying as shown in FIG. 10 is caused to be in a state shown in FIG. 14 by the above-described adjustment of the tap coefficients of the digital equalizer 24. In this case, the equalized output data has a histogram of the frequencies of its levels shown in FIG. 15. In this case, as described with respect to step S5 of FIG. 12, the count values of the levels 40 and 24 (cntr 40 and cntr 24) are smaller than the reference value (target value) "1". Therefore, it can be determined that the proper number of discrete values (3) is obtained.

The determination as to whether a proper number of discrete values is obtained from a histogram of the numbers of outputs of the levels of the equalized output data can also be performed based on the numbers of distribution areas of the histogram each of which areas has a standard deviation less than or equal to a given value.

In the above-described embodiment, the description has been given of the case where a signal is recorded in the PR(1, 1) waveform on the recording medium. However, the present invention is not limited to this. For instance, in the case of recording a signal in a PR(1, 2, 1) waveform of a constraint length 3, the levels of reproduced data can be five in number. In that case, the same operation can be performed, letting the number of discrete values being 5.

Further, the present invention is not limited to the case where a signal is recorded in a partial response (PR) waveform. The present invention can be applied to any system in which the levels of reproduced data can be determined from a recording code.

Moreover, although the tap coefficients of the digital equalizer of a transversal type are adjusted in the above-described embodiment, the present invention can also employ a waveform equalizer of another type and adjust its equalization characteristic. By adjusting a function that works the same way as a waveform equalizer (, such as reproduction power adjustment or recording power adjustment), the same effect can be obtained.

Furthermore, since it can be determined from an obtained histogram whether a recording medium is acceptable or not, data storage reliability can be increased by using an alternate sector for a bad sector.

Next, a description will be given of another embodiment.

In this embodiment, expected values employed in the Viterbi detector 100 are set, based on the information of a histogram created in the same manner as in the above-described embodiment, in the read system unit 25 of the magneto-optical disk unit shown in FIG. 1.

Figure 16:
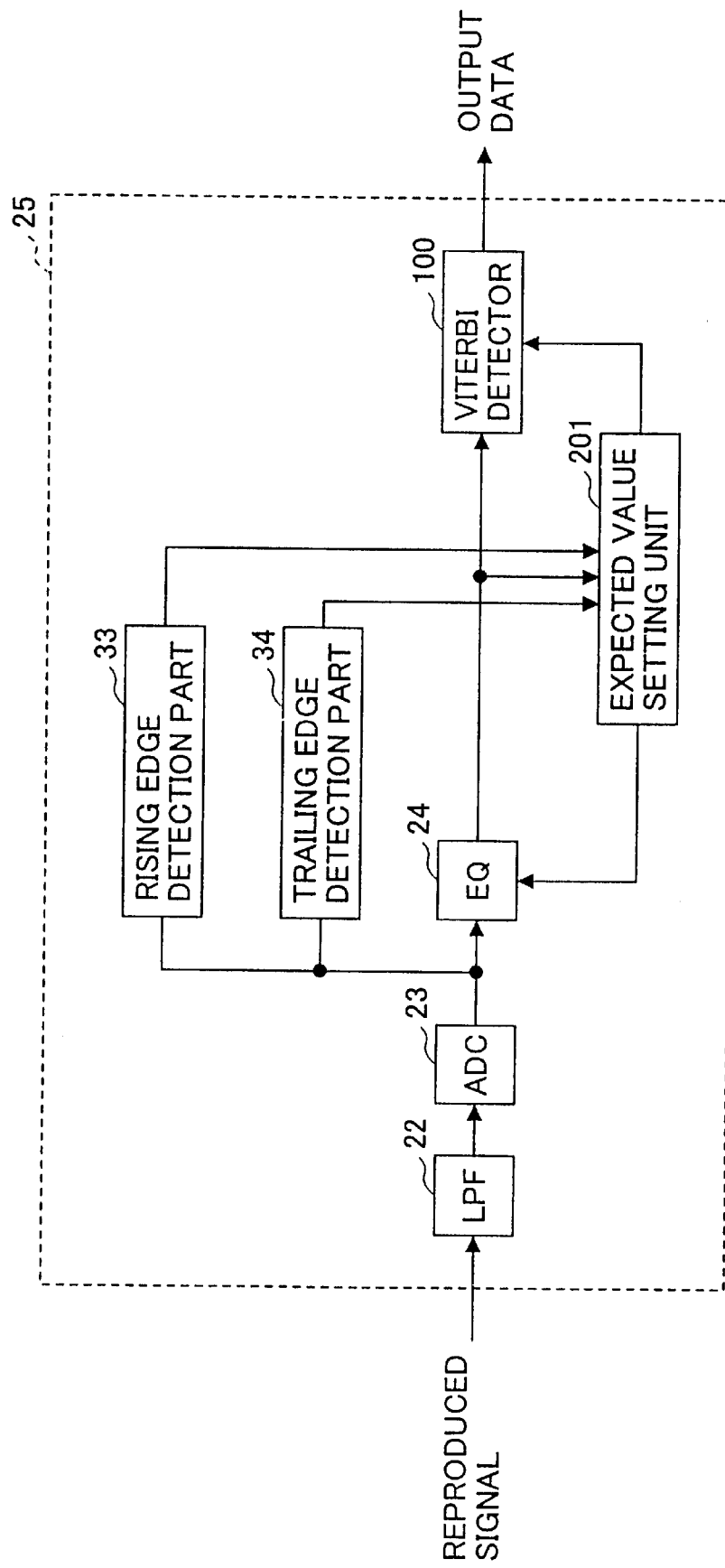
FIG. 16 is a diagram showing a structure of the read system.

In this embodiment, the read system unit 25 has a structure shown in FIG. 16.

In FIG. 16, the read system unit 25, as in the above-described embodiment (see FIG. 2), includes the low-pass filter (LPF) 22, the analog-to-digital converter (ADC) 23, the digital equalizer 24, and the Viterbi detector 100. Further, the read system unit 25 includes a rising edge detection circuit 33 and a trailing edge detection circuit 34 in addition to an expected value setting unit 201 that replaces the equalizer control unit 200.

Figure 17:
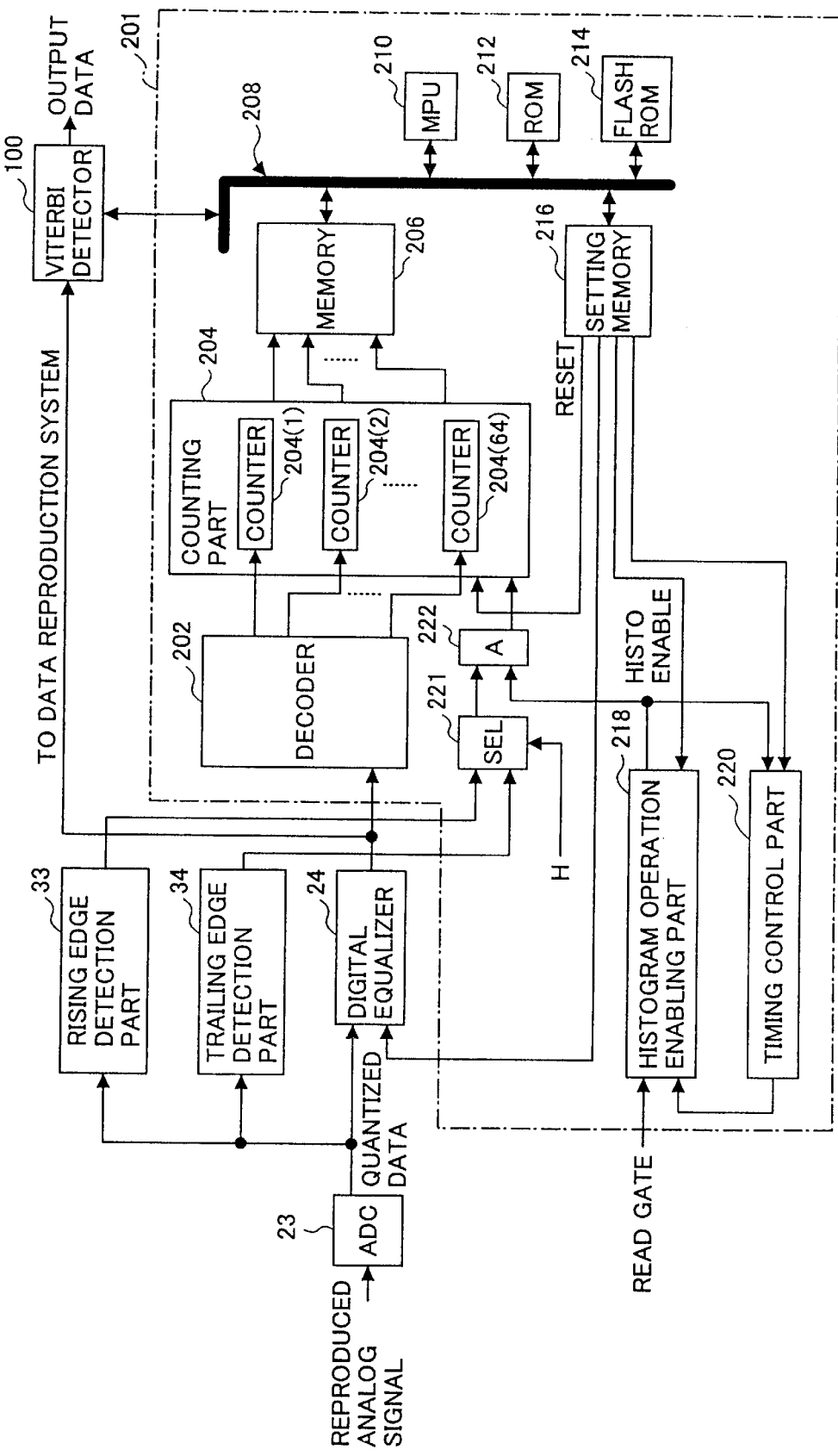
FIG. 17 is a block diagram showing a detailed structure of an expected value setting unit.

The expected value setting unit 201 has a structure shown in FIG. 17. In FIG. 17, the same elements as those of the equalizer control unit 200 shown in FIG. 4 are referred to by the same numerals, and a description thereof will be omitted.

In FIG. 17, the quantized data from the analog-to-digital converter 23 is sequentially input to the rising edge detection circuit 33, which detects a rising edge of the reproduced signal based on a change in the quantized data. The quantized data from the analog-to-digital converter 23 is sequentially input to the trailing edge detection circuit 34, which detects a trailing edge of the reproduced signal based on a change in the quantized data. A rising edge detection signal ONEDGE_DET from the rising edge detection circuit 33 and a trailing edge detection signal OFFEDGE_DET from the trailing edge detection circuit 34 are supplied to the expected value setting unit 201.

Like the above-described equalizer control unit 200, the expected value setting unit 201 includes the decoder 202, the counting part 204, the histogram memory 206, the MPU 210, the ROM 212, the nonvolatile memory 214, the setting memory 216, the histogram operation enabling part 218, and the timing control part 220. The expected value setting unit additionally includes a selector 221 and an AND circuit 222.

The rising edge detection signal ONEDGE_DET from the rising edge detection circuit 33 and the trailing edge detection signal OFFEDGE_DET from the trailing edge detection circuit 34 are input to the selector 221, which selects one of the rising edge detection signal ONEDGE_DET and the trailing edge detection signal OFFEDGE_DET. The enabling signal (histo enable) is supplied from the histogram operation enabling part 218 to the counting part 204 via the AND circuit 222 that is controlled by the one of the detection signals selected by the selector 221.

The selector 221 can be fixed at a HIGH level (H) all the time based on a command from the MPU 210 irrespective of a state of the rising or trailing edge detection signal ONEDGE_DET or OFFEDGE_DET. In this case, the AND circuit 222 is caused to be always in an enabled state by a high-level signal supplied from the selector 221, and the enabling signal (histo enable) is supplied all the time to the counting part 204 via the AND circuit 222.

That is, if the selector 221 is fixed at the HIGH level, the enabling signal (histo enable) supplied from the histogram operation enabling part 218 is made valid (for instance, HIGH) so as to have each of the counters 204(1) through 204(64) of the counting part 204 perform a count operation. If the selector 221 is not fixed at the HIGH level, each of the counters 204(1) through 204(64) of the counting part 204 performs a count operation on condition that the enabling signal (histo enable) supplied from the histogram operation enabling part 218 is made valid with one of the rising edge detection signal ONEDGE_DET and the trailing edge detection signal OFFEDGE_DET selected by the selector 221 being made valid (for instance, HIGH).

Figure 18:
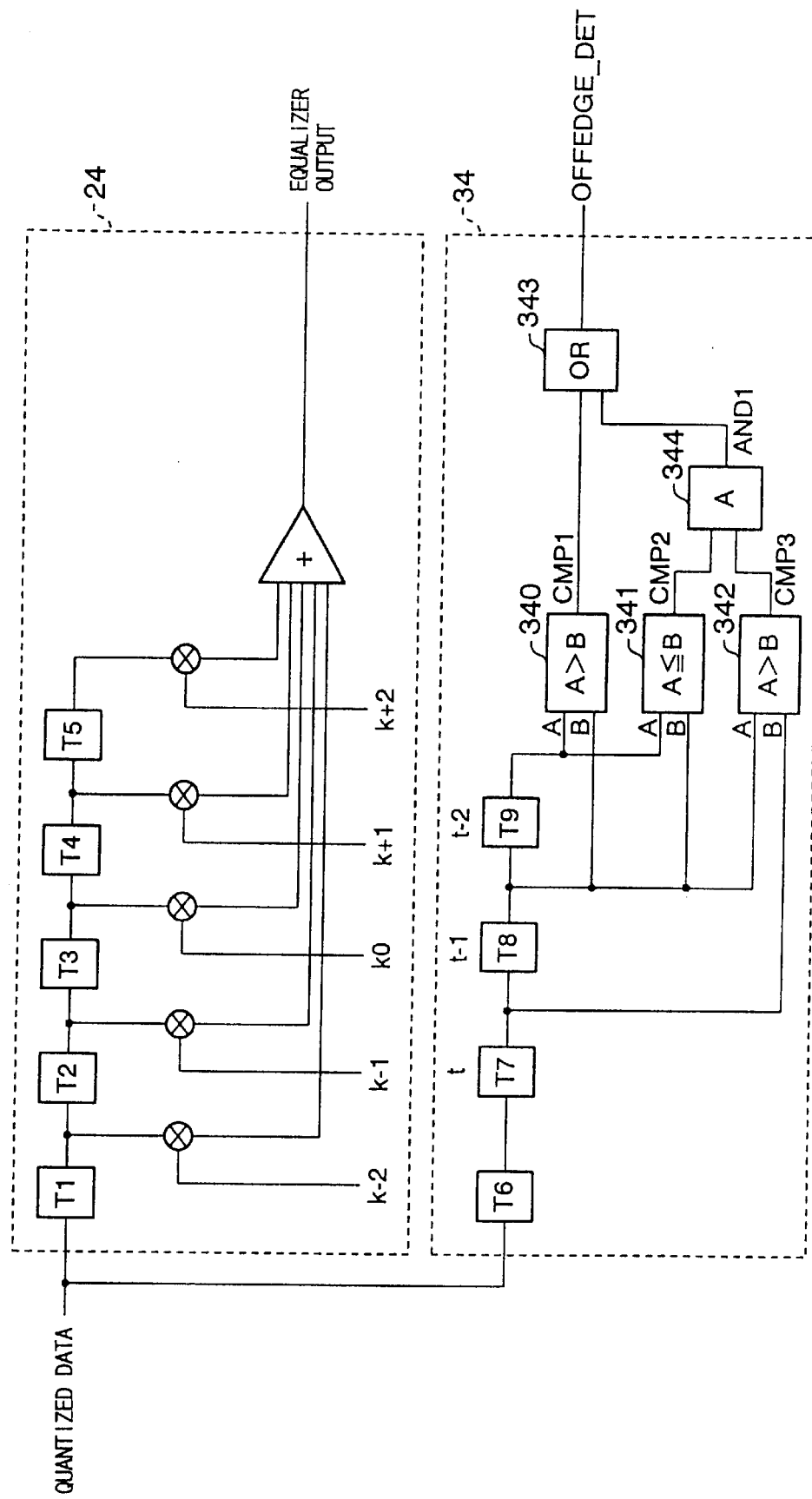
FIG. 18 is a diagram showing structures of the digital equalizer and a trailing edge detection part.

The trailing edge detection circuit 34 and the digital equalizer 24 have structures shown in FIG. 18.

In FIG. 18, the digital equalizer 24, as in the above-described embodiment, is formed of the transversal filter including a series of five cascaded delay elements (registers) T1 through T5, and has the adjustable tap coefficients k−2, k−1, k0, k+1, and k+2 for the respective delay elements.

The trailing edge detection circuit 34 includes a series of four cascaded delay elements (registers) T6 through T9, a first comparator 340, a second comparator 341, a third comparator 342, an OR element 343, and an AND element 344. The quantized data supplied from the analog-to-digital converter (ADC) 23 is input to the first delay element T6, and the quantized data input to the delay element T6 is shifted to the delay elements T7, T8, and T9 sequentially in accordance with a clock signal.

The first comparator 340 compares the quantized data (A) set in the fourth delay element T9 at a time t−2 and the quantized data (B) set in the third delay element T8 at a time t−1, and outputs a detection signal CMP1 that is valid when the quantized data (A) is larger than the quantized data (B) (A>B). The second comparator 341 compares the quantized data (A) set in the fourth delay element T9 at the time t−2 and the quantized data (B) set in the third delay element T8 at the time t−1, and outputs a detection signal CMP2 that is valid when the quantized data (A) is smaller than or equal to the quantized data (B) (A>B). The third comparator 342 compares the quantized data (A) set in the third delay element T8 at the time t−1 and the quantized data (B) set in the second delay element T7 at a time t, and outputs a detection signal CMP3 that is valid when the quantized data (A) is larger than the quantized data (B) (A≦B).

An AND signal AND1 of the detection signal CMP2 supplied from the second comparator 341 and the detection signal CMP3 supplied from the third comparator 342 is generated in the AND element 344. An OR signal of the detection signal CMP1 supplied from the first comparator 340 and the AND signal supplied from the AND element 344 is generated in the OR element 343 to be output therefrom as the trailing edge detection signal OFFEDGE_DET of the trailing edge detection circuit 34.

The trailing edge detection circuit 34 of the above-described structure detects a trailing edge of the reproduced signal based on the comparison results of the quantized data of the three consecutive timings (t−2, t−1, and t) provided by the synchronizing clock signal.

Figure 19:
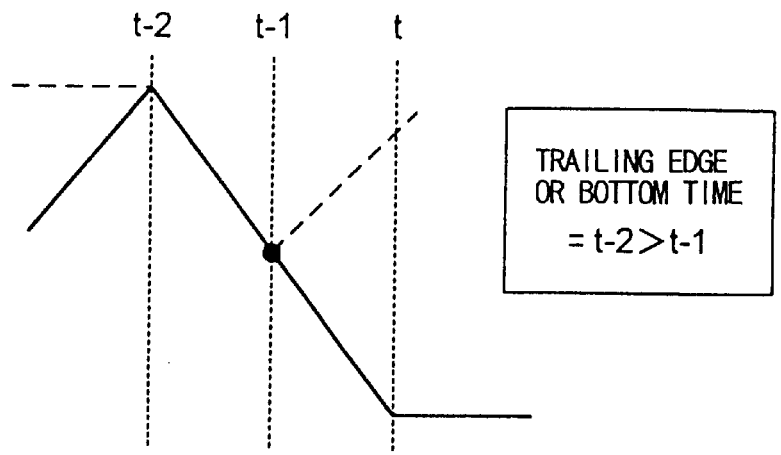
FIG. 19 is a diagram showing a trailing edge condition of a waveform.

That is, if the quantized data set in the delay element T8 (t−1) is smaller than the preceding quantized data set in the delay element T9 (t−2) (if the detection signal CMP1 supplied from the first comparator 340 is valid), it is determined that the data corresponds to a trailing edge of the reproduced signal and the trailing edge detection signal OFFEDGE_DET is made valid. In this case, it makes no difference whether the quantized data set in the delay element T8 (t−1) is larger or smaller than the next quantized data set in the delay element T7 (t). If, as shown in FIG. 19, the quantized data set in the delay element T8 (t−1) is smaller than the next quantized data set in the delay element T7 (t) (see a broken line), the quantized data set in the delay element T8 represents a bottom value. If the quantized data set in the delay element T8 (t−1) is larger than the next quantized data set in the delay element T7 (t) (see a solid line), the quantized data set in the delay element T8 (t−1) represents a value in a trailing edge of the reproduced signal.

Figure 20:
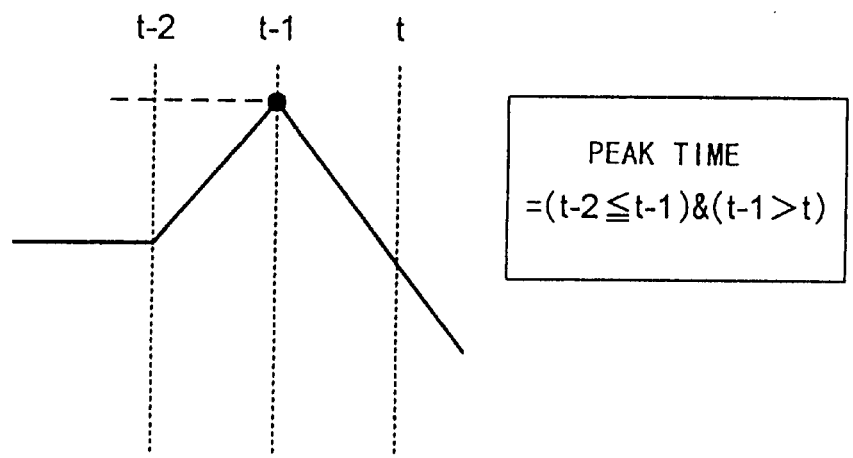
FIG. 20 is a diagram showing a peak time condition of a waveform.

If the quantized data set in the delay element T8 (t−1) is larger than or equal to the preceding quantized data set in the delay element T9 (t−2) (the detection signal CMP2 supplied from the second comparator 341 is valid) and is smaller than the next quantized data set in the delay element T7 (t) (the detection signal CMP3 supplied from the third comparator 342 is valid), the quantized data set in the delay element T8 (t−1), as shown in FIG. 20, represents a peak value. Also in this case, it is determined that the data corresponds to a trailing edge of the reproduced signal, and the trailing edge detection signal OFFEDGE_DET is made valid.

Figure 21:
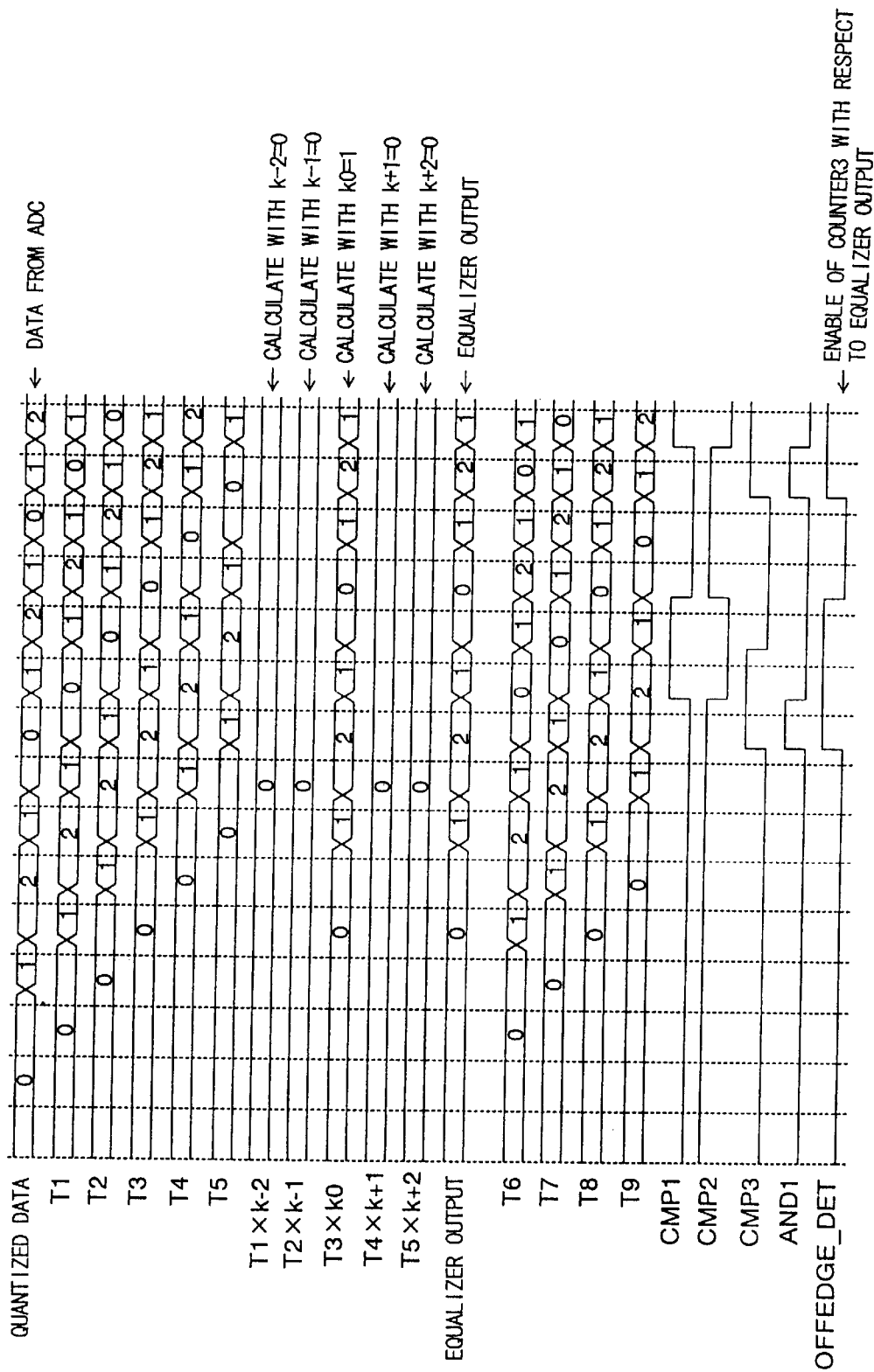
FIG. 21 is a diagram showing timing of trailing edge detection and an equalizer output.

FIG. 21 shows a relation between the output of the digital equalizer 24 and the trailing edge detection signal OFFEDGE_DET supplied from the trailing edge detection circuit 34. In FIG. 21, vertical dotted lines represent the rising timings of the clock signal, in accordance with which each circuit operation is performed.

In an example shown in FIG. 21, the tap coefficients k−2, k−1, k0, k+1, and k+2 of the digital equalizer 24 are set to 0, 0, 1, 0, and 0, respectively. Therefore, an output data from the third delay element T3 directly becomes the output data of the digital equalizer 24. Further, since the third delay element T8 of the trailing edge detection circuit 34 provides a delay of the same amount as the third delay element of the digital equalizer 24, an output data from the delay element. T8 of the trailing edge detection circuit 34 becomes identical to the output data of the digital equalizer 24 at each timing.

In FIG. 21, the detection signal CMP3 supplied from the third comparator 342 is made valid when the output data of the delay elements T9, T8, and T7 of the trailing edge detection circuit 34 become, for instance, (2, 2, 1) (which is a-state shown in FIG. 20). The detection signal CMP1 supplied from the first comparator 340 is made valid and the detection signal CMP2 supplied from the second comparator 341 is made invalid when the output data of the delay elements T9, T8, and T7 become, for instance, (2, 1, 0) (which is a state shown in FIG. 19). As a result, the trailing edge detection signal OFFEDGE_DET that is valid (HIGH) during the transition of the output data of the delay elements T9, T8, and T7 from (2, 2, 1) to (2, 1, 0) and to (1, 0, 0) is output from the trailing edge detection circuit 34. Likewise, hereinafter, the trailing edge detection signal OFFEDGE_DET is made valid (HIGH) while the output data of the delay elements T9, T8, and T7 is in the states shown in FIGS. 19 and 20.

Figure 22:
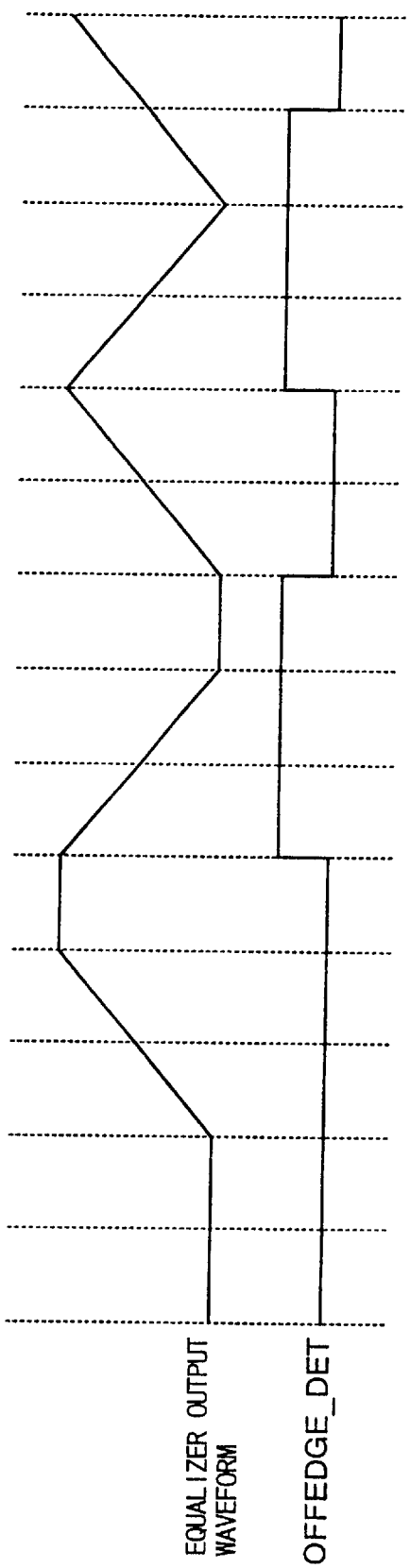
FIG. 22 is a diagram showing timing of an equalizer output waveform and an output of the trailing edge detection part.

FIG. 22 shows a relation between the above-described output of the digital equalizer 24 in the case shown in FIG. 21 and the trailing edge detection signal OFFEDGE_DET. That is, the trailing edge detection signal OFFEDGE_DET is made valid at trailing edges of the reproduced signal (corresponding to the output of the digital equalizer 24).

Figure 23:
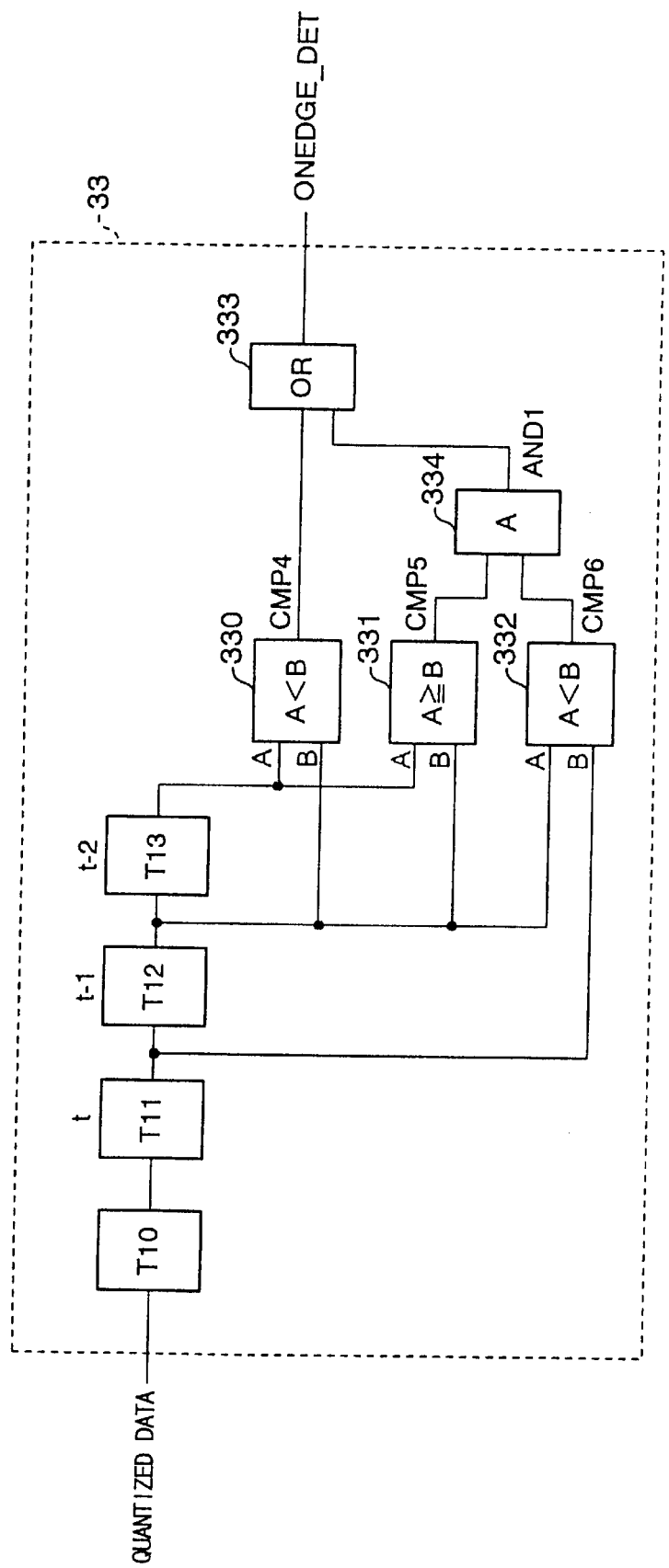
FIG. 23 is a diagram showing a structure of a rising edge detection part.

The rising edge detection circuit 33 has a structure show in FIG. 23.

In FIG. 23, the rising edge detection circuit 33 includes a series of four cascaded delay elements (registers) T10 through T13, a first comparator 330, a second comparator 331, a third comparator 332, an OR element 333, and an AND element 334. The quantized data supplied from the analog-to-digital converter (ADC) 23 is input to the first delay element T10, and is shifted to the delay elements T11, T12, and T13 sequentially in accordance with the clock signal.

The first comparator 330 compares the quantized data (A) set in the fourth delay element T13 at the time t−2 and the quantized data (B) set in the third delay element T12 at the time t−1, and outputs a detection signal CMP4 that is valid when the quantized data (A) is smaller than the quantized data (B) (A<B). The second comparator 331 compares the quantized data (A) set in the fourth delay element T13 at the time t−2 and the quantized data (B) set in the third delay element T12 at the time t−1, and outputs a detection signal CPM5 that is valid when the quantized data (A) is larger than or equal to the quantized data (B) (A≧B). The third comparator 332 compares the quantized data (A) set in the third delay element T12 at the time t−1 and the quantized data (B) set in the second delay element T11 at the time t, and outputs a detection signal CMP6 that is valid when the quantized data (A) is smaller than the quantized data (B) (A<B).

An AND signal AND1 of the detection signal CMP5 supplied from the second comparator 331 and the detection signal CMP6 supplied from the third comparator 332 is generated in the AND element 334. An OR signal of the detection signal CMP4 supplied from the first comparator 330 and the AND signal AND1 supplied from the AND element is generated in the OR element 333 to be output therefrom as the rising edge detection signal ONEDGE_DET of the rising edge detection circuit 33.

Like the above-described trailing edge detection circuit 34, the rising edge detection circuit 33 of the above-described structure detects a rising edge of the reproduced signal based also on the comparison results of the quantized data of the three consecutive timings (t−2, t−1, and t) provided by the synchronizing clock signal.

Figure 24:
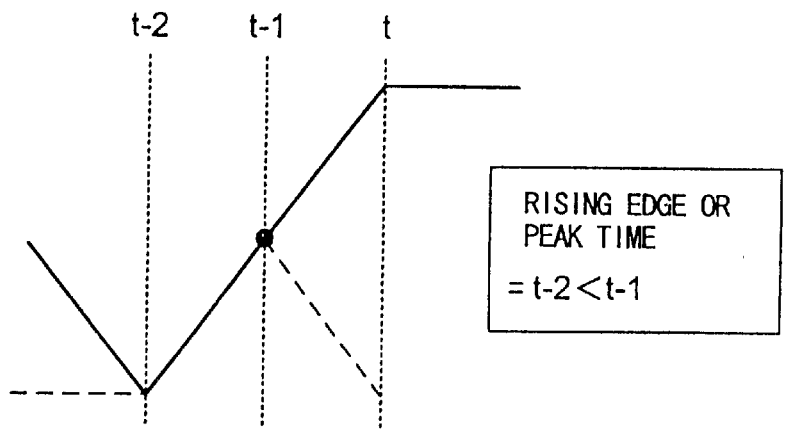
FIG. 24 is a diagram showing a rising edge condition of a waveform.

That is, if the quantized data set in the delay element T12 (t−1) is larger than the preceding quantized data set in the delay element T13 (t−2) (if the detection signal CMP4 supplied from the first comparator 330 is valid), it is determined that the data corresponds to a rising edge of the reproduced signal and the rising edge detection signal ONEDGE_DET is made valid. In this case, it makes no difference whether the quantized data set in the delay element T12 (t−1) is larger or smaller than the next quantized data set in the delay element T11 (t). If, as shown in FIG. 24, the quantized data set in the delay element T12 (t−1) is smaller than the next quantized data set in the delay element T11 (t) (see a solid line), the quantized data set in the delay element T12 represents a value in a rising edge of the reproduced signal. If the quantized data set in the delay element T12 (t−1) is larger than the next quantized data set in the delay element T11 (t) (see a broken line), the quantized data set in the delay element T12 (t−1) represents a peak value.

Figure 25:
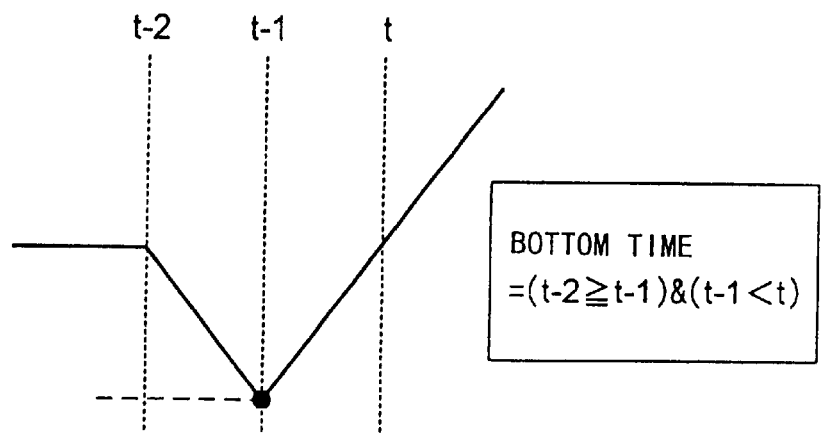
FIG. 25 is a diagram showing a bottom time condition of a waveform.

If the quantized data set in the delay element T12 (t−1) is smaller than or equal to the preceding quantized data set in the delay element T13 (t−2) (the detection signal CMP5 supplied from the second comparator 331 is valid) and is smaller than the next quantized data set in the delay element T11 (t), the quantized data set in the delay element T12 (t−1), as shown in FIG. 25, represents a bottom value. Also in this case, it is determined that the data corresponds to a rising edge of the reproduced signal, and the rising edge detection signal ONEDGE_DET is made valid.

The rising edge detection circuit 33 of the above-described structure outputs the rising edge detection signal ONEDGE_DET that is made valid (HIGH) at a rising edge of the reproduced signal (see FIGS. 24 and 25).

In the above-described expected value setting unit 201, an operation for determining the expected values employed in the Viterbi detector 100 is performed under the control of the MPU 210.

This operation may be performed by reading out test data prerecorded on the magneto-optical disk 10, or by reading out data recorded on the magneto-optical disk 10 as necessary data. Further, this operation may be performed at regular intervals when the power is turned on, a read error is detected, and the recording medium (the magneto-optical disk 10) is replaced with another.

While the output of the selector 221 is valid (HIGH), as in the case of the equalizer control unit 200 of the above-described embodiment, the frequencies of the levels of the equalized output data sequentially supplied from the digital equalizer is counted in the counting part 204. The counting results are stored in the histogram memory 206 as a histogram representing a distribution of the frequencies of the levels of the equalized output data. The MPU 210 reads out the data of the histogram from the histogram memory 206 to calculate the average level value of each concentration in the histogram, and defines the average level value of each concentration as an expected value to be employed in the Viterbi detector 100.

A specific description will now be given of expected values determined in a case where data is recorded on the magneto-optical disk 10 in accordance with PR(1, 1) of a constraint length 2. In the case of PR(1, 1), there are three expected values corresponding to a peak value, a center value (in each of trailing and rising edges), and a bottom value of the reproduced signal.

Figure 26:
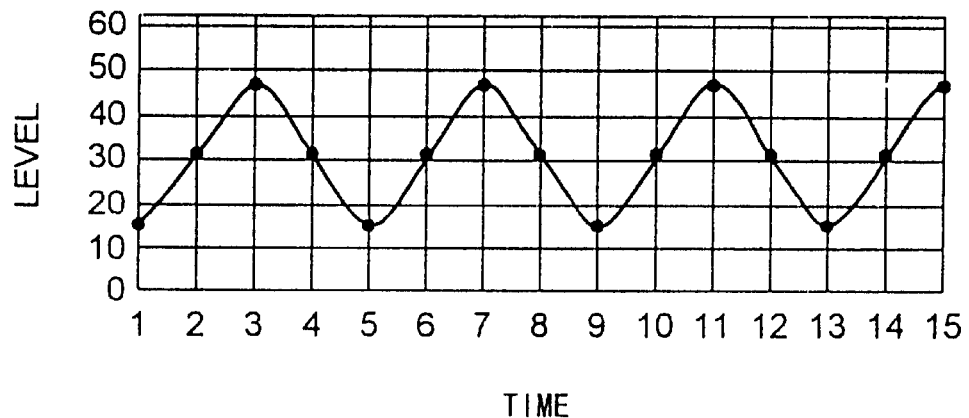
FIG. 26 is a diagram showing an ideal reproduced signal.
Figure 27:
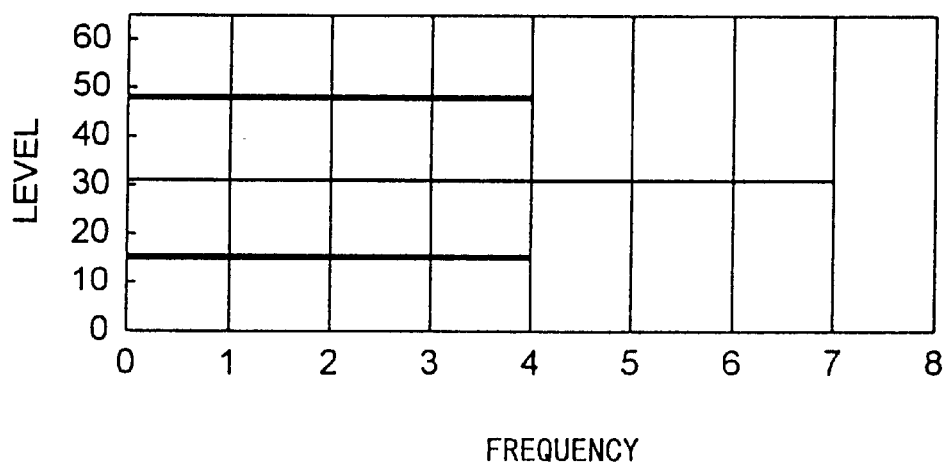
FIG. 27 is a diagram showing a histogram of sampled values of the reproduced signal shown in FIG. 26.

If the output of the selector 221 is fixed at the HIGH level (H) based on the command from the MPU 210, a histogram of the frequencies of the levels of the entire reproduced signal is created. If the reproduced signal has an ideal waveform without a droop or offset as shown in FIG. 26, a histogram of the frequencies of the levels as shown in FIG. 27 is created. In this case, expected values corresponding to the peak value, center value (in each of the trailing and rising edges), and bottom value of the reproduced signal are defined as levels 47, 31, and 15, respectively.

Figure 28:
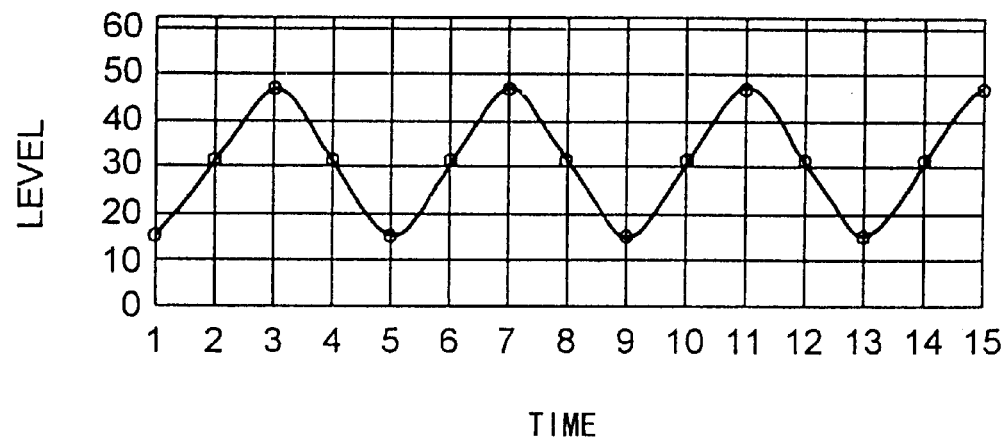
FIG. 28 is a diagram showing an example of the reproduced signal.
Figure 29:
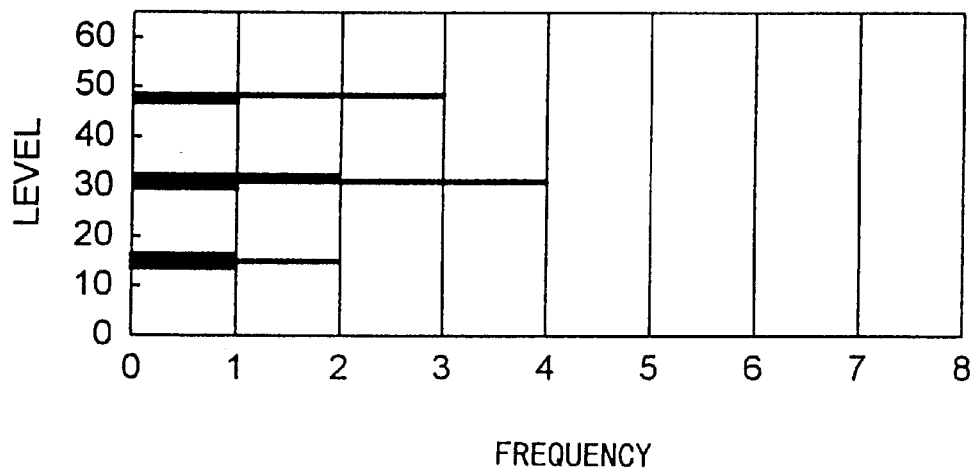
FIG. 29 is a diagram showing a histogram of sampled values of the reproduced signal shown in FIG. 28.

Likewise, in the case of creating a histogram representing the frequencies of the levels of the entire reproduced signal having a waveform slightly losing a shape compared with the ideal waveform as shown in FIG. 28 with the output of the selector 221 being fixed at the HIGH level (H), a histogram as shown in FIG. 29 is obtained. In this case, although each concentration of the histogram has a certain width, the average level values of the concentrations are levels 47, 31, and 15. Therefore, as in the case of the reproduced signal of the ideal waveform, the expected values corresponding to the peak value, center value (in each of the rising and trailing edges), and bottom value of the reproduced signal are defined as levels 47, 31, and 15, respectively.

Figure 30:
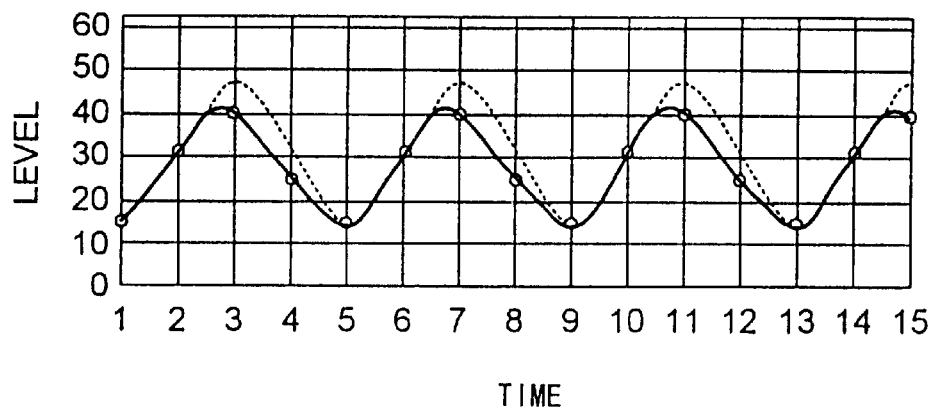
FIG. 30 is a diagram showing a reproduced signal with droops.
Figure 31:
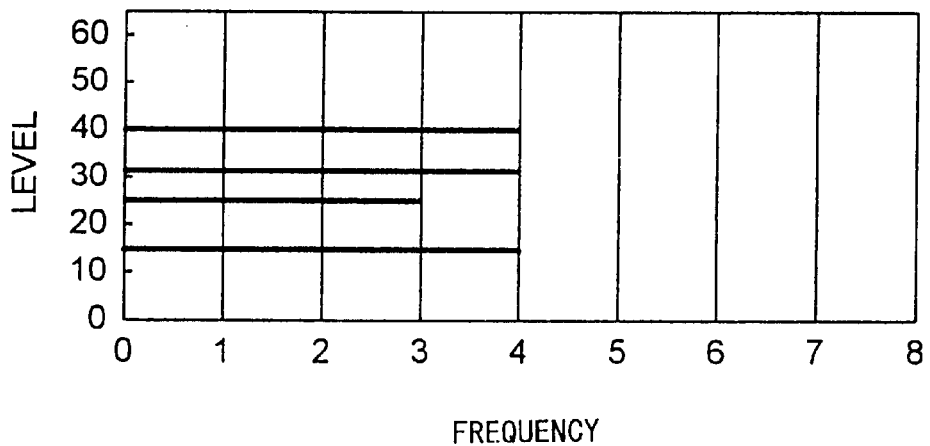
FIG. 31 is a diagram showing a histogram of sampled values of the reproduced signal shown in FIG. 30.

Further, in the case of creating a histogram representing the frequencies of the levels of the entire reproduced signal having a waveform with droops as shown in FIG. 30 with the output of the selector 221 being fixed at the HIGH level (H), a histogram as shown in FIG. 31 is obtained. In this case, four concentrations of levels 40, 31, 25, and 15 are formed in the histogram. Therefore, the expected values corresponding to the peak value, center value (at the rising edge), center value (at the trailing edge), and bottom value of the reproduced signal are defined as levels 40, 31, 25, and 15, respectively.

In FIG. 30, a broken line indicates the ideal waveform of the reproduced signal.

Figure 32:
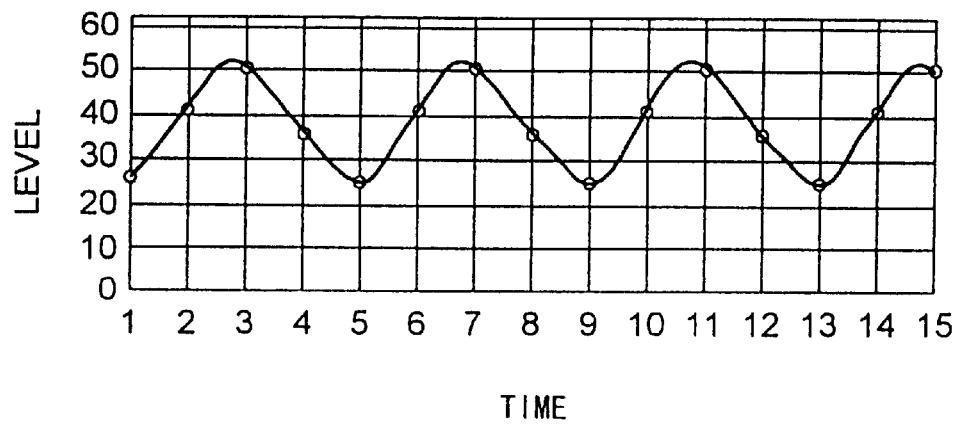
FIG. 32 is a diagram showing a reproduced signal with droops and offsets.
Figure 33:
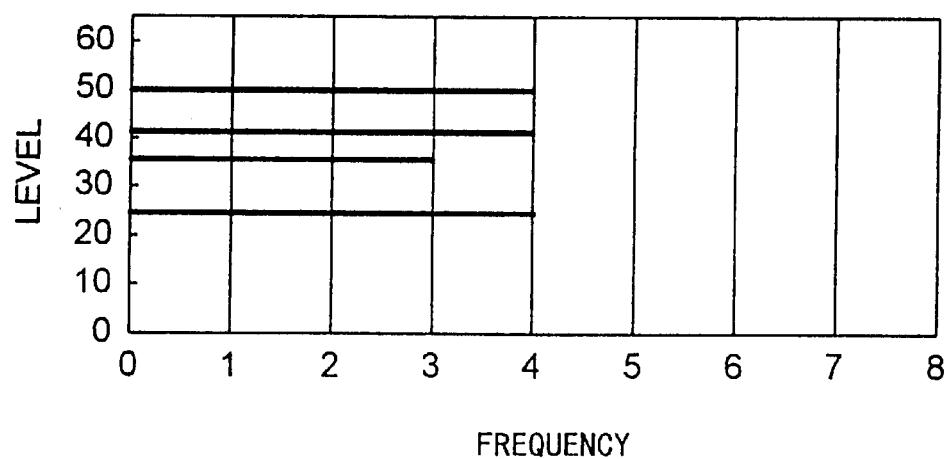
FIG. 33 is a diagram showing a histogram of sampled values of the reproduced signal shown in FIG. 32.

In the case of creating a histogram representing the frequencies of the levels of the entire reproduced signal having a waveform with droops and offsets as shown in FIG. 32 with the output of the selector 221 being fixed at the HIGH level (H), a histogram as shown in FIG. 33 is obtained. In this case, four concentrations of levels 50, 41, 35, and 25 are formed in the histogram. Therefore, the expected values corresponding to the peak value, center value (at the rising edge), center value (at the trailing edge), and bottom value of the reproduced signal are defined as levels 50, 41, 35, and 25, respectively.

Figure 34:
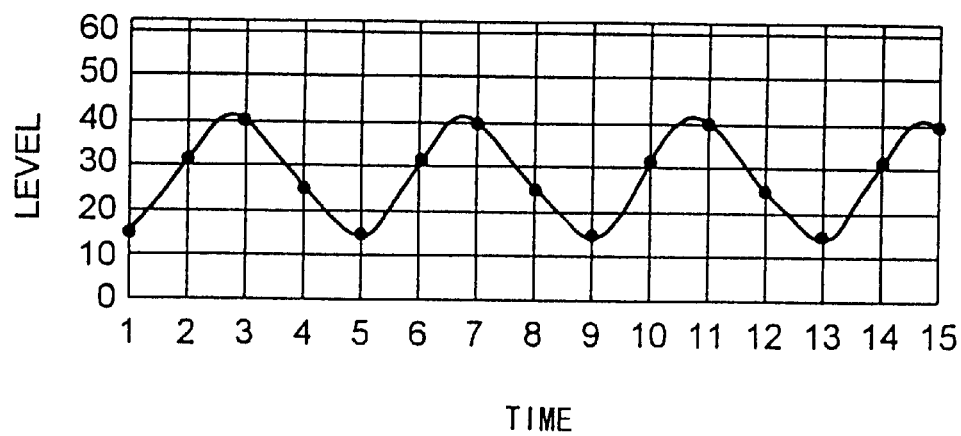
FIG. 34 is a diagram showing the reproduced signal with droops.
Figure 35:
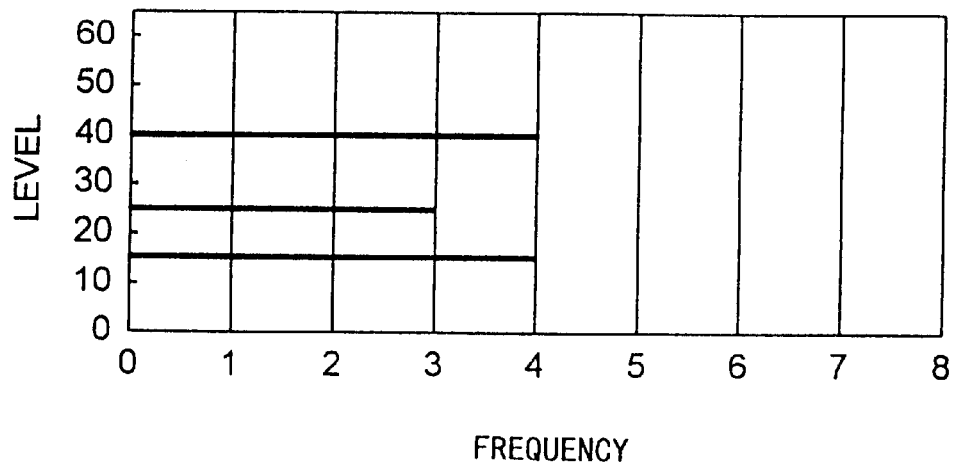
FIG. 35 is a diagram showing a histogram of sampled values of the reproduced signal shown in FIG. 34 in a case where the trailing edge detection part is employed.

Moreover, in the case of creating a histogram representing the frequencies of the levels of a trailing edge of the reproduced signal having a waveform with droops as shown in FIG. 34 (equal to the waveform shown in FIG. 30) with the selector 221 selecting the trailing edge detection signal OFFEDGE_DET supplied from the trailing edge detection circuit 34, a histogram as shown in FIG. 35 is obtained. In this case, three concentrations of levels 40, 25, and 15 are formed in the histogram. Therefore, the expected values corresponding to the peak value, center value (at the trailing edge), and bottom value of the reproduced signal are defined as levels 40, 25, and 15, respectively. In this case, since no histogram representing the frequencies of the levels of a rising edge of the reproduced signal is created, the expected value corresponding to the center value at the rising edge of the reproduced signal is not defined.

Figure 36:
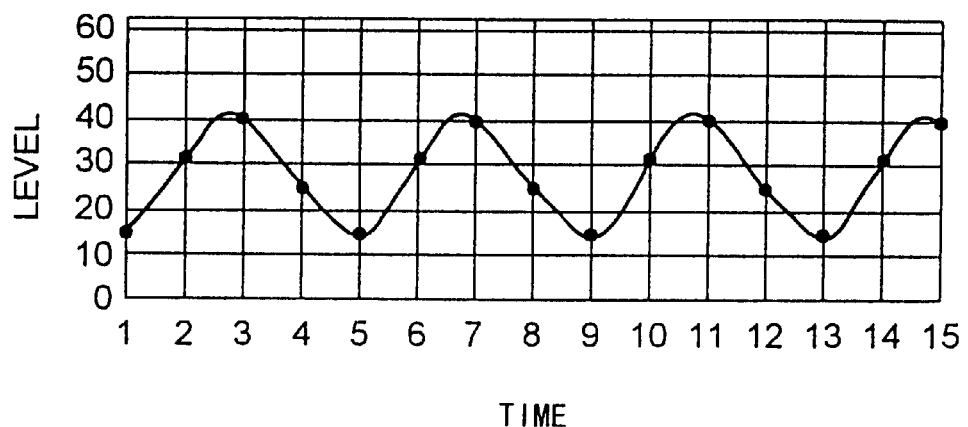
FIG. 36 is a diagram showing the reproduced signal with droops.
Figure 37:
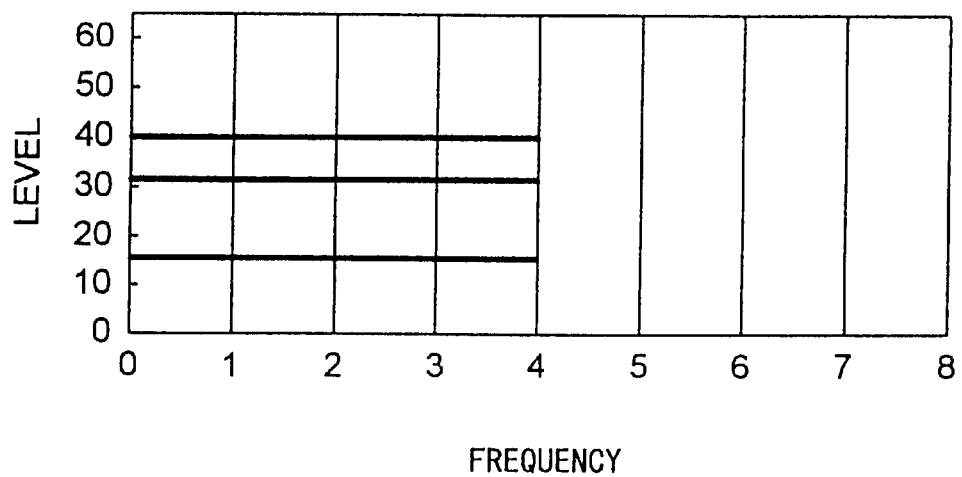
FIG. 37 is a diagram showing a histogram of sampled values of the reproduced signal shown in FIG. 36 in a case where the rising edge detection part is employed.

In the case of creating a histogram representing the frequencies of the levels of a rising edge of the reproduced signal having a waveform with droops as shown in FIG. 36 (equal to the waveform shown in FIG. 30) with the selector 221 selecting the rising edge detection signal ONEDGE_DET supplied from the rising edge detection circuit 33, a histogram as shown in FIG. 37 is obtained. In this case, three concentrations of levels 40, 31, and 15 are formed in the histogram. Therefore, the expected values corresponding to the peak value, center value (at the rising edge), and bottom value of the reproduced signal are defined as levels 40, 31, and 15, respectively. In this case, since no histogram representing the frequencies of the levels of a trailing edge of the reproduced signal is created, the expected value corresponding to the center value at the trailing edge of the reproduced signal is not defined.

As previously described, in the case where the reproduced signal has a waveform distortion (droop) in its trailing edge, the expected values determined from the sampled values (equalized output data) of the rising edge of the reproduced signal are identical to those determined from the reproduced signal of the ideal waveform (see FIGS. 26 and 27).

The expected values matching the distortion of the reproduced signal can also be determined by considering, as described above, both of the histogram of the frequencies of the levels of the reproduced signal in its trailing edge and the histogram of the frequencies of the levels of the reproduced signal in its rising edge.

The expected values thus determined are supplied to the Viterbi detector 100 in accordance with the control of the MPU 210. The Viterbi detector 100, at a time of data reproduction from the magneto-optical disk 10, determines data of maximum likelihood in accordance with the Viterbi decoding algorithm employing the comparison results of the supplied expected values and the equalized output data supplied from the digital equalizer 24.

In the above-described embodiment, even if the reproduced signal includes a steady distortion (droop) in a case where a RAD medium is used as the magneto-optical disk 10, the expected values to be employed in the Viterbi detector 100 are determined based on quantized data obtained from the distorted reproduced signal in synchronism with a single clock signal. Therefore, even if the reproduced signal from the magneto-optical disk 10 includes a steady distortion, the Viterbi detector 100 determines the data from the quantized data (equalized output data) based on the expected values determined based on the distorted waveform, thus achieving more accurate data reproduction.

Further, the expected values thus determined can be stored in the nonvolatile memory by the type of a recording medium to be used. In this case, expected values corresponding to the type of a recording medium to be set are read out from the nonvolatile memory 214 to be supplied to the Viterbi detector 100. Therefore, it is not necessary that such a histogram as described above is created every time the type of a recording medium to be used is changed.

In the above-described embodiment, the description has been given of the reproduction of data recorded on the magneto-optical disk in accordance with PR(1, 1), but the present invention is also applicable in a case where data is recorded in accordance with PR of a higher level.

Figure 38:
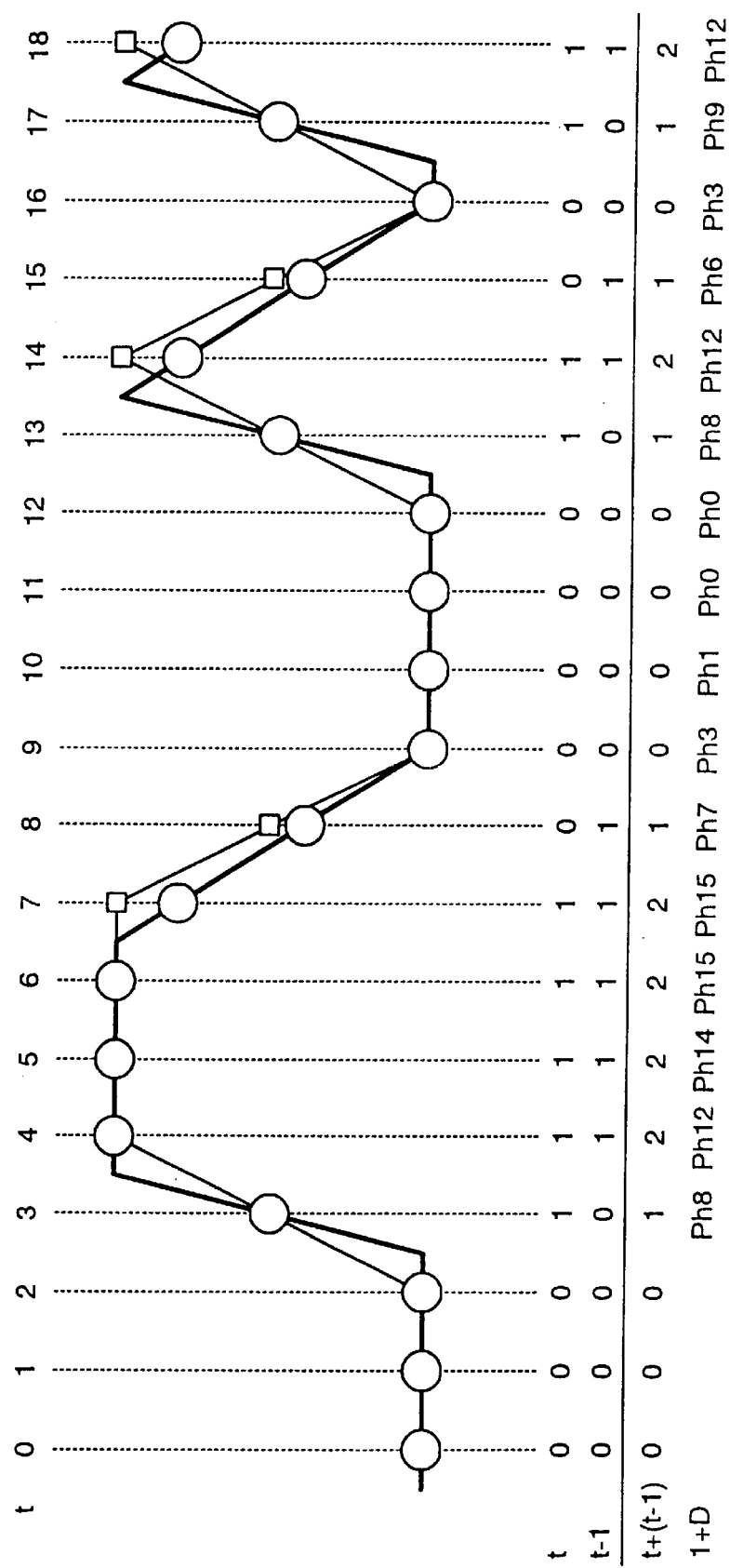
FIG. 38 is a diagram showing waveforms of quantized data and expected values.

FIG. 38 shows a reproduced signal of data recorded, for instance, in accordance with constraint length 4 PR(1 1 0 0). In FIG. 38, a fine line (a square indicates a sampled value) represents the ideal waveform of the reproduced signal, and a bold line (a circle indicates a sampled value) represents a distorted waveform of the reproduced signal.

In FIG. 38, the sum (t+(t−1)) of data (t) and data (t−1) delayed by one clock pulse represents the reproduced signal when the data varying as indicated on a time base t is recorded. Further, in the case of constraint length 4 PR(1 1 0 0), 16 expected values Ph0 through Ph15 are determined from quantized data of four consecutive timings (t, t−1, t−2, t−3) as shown in FIG. 39. For instance, in a case where the peak value, center value at the trailing edge, and bottom value of the reproduced signal are defined as the levels 40, 25, and 15, respectively, as shown in FIGS. 34 and 35 and the center value at the rising edge of the reproduced signal is defined as the level 31 as shown in FIGS. 36 and 37, the expected values Ph0, Ph1, and Ph3 are set to the level 15 corresponding to the bottom value (0), the expected values Ph6 and Ph7 are set to the level 25 corresponding to the center value (1) at the trailing edge, the expected values Ph8 and Ph9 are set to the level 31 corresponding to the center value (1) at the rising edge, and the expected values Ph12, Ph14, and Ph15 are set to the level 40 corresponding to the peak value (2).

In the case of using an RLL code, nonexistent data combinations are produced to generate expected values that do not have to be defined. In the case of the (1, 7) RLL code, it is unnecessary to define the expected values Ph2, Ph4, Ph5, Ph10, Ph11, and Ph13 due to D restriction by the (1, 7) runlength-limited RLL code.

In an operation (ML) performed by the Viterbi detector 100 using the expected values Ph0 through Ph15 thus determined, sampled values higher than or equal to the level 40 are processed as the closest values to the expected values of the level 40 (Ph12, Ph14, and Ph15).

The Viterbi detector 100 performing an operation in accordance with the Viterbi decoding algorithm using the expected values thus determined has a structure shown in FIG. 40.

In FIG. 40, the Viterbi detector 100 includes a path metric memory 100(1), a branch metric calculation unit 100(2), an ACS unit 100(3), and a path memory 100(4).

The branch metric calculation unit 100(2) calculates a branch metric value corresponding to a difference between each expected value that is a correct value of the reproduced signal to be taken and a sampled value of the reproduced signal. The ACS unit 100(3) adds the above branch metric value to a path metric value of a preceding clock timing stored in the path metric memory 100(1), and compares each two of the path metric values obtained after the addition to select the smaller of the two. The selected path metric value is stored in the path metric memory 100(1) as a new path metric value. As a result of the above-described operation, the path metric value is obtained as a cumulative value of branch metric values.

Selecting a smaller path metric value as previously described corresponds to selecting a state transition path in the Viterbi decoding algorithm. That is, the ACS unit 100(3) always selects a path that minimizes the path metric value.

Data corresponding to the path selected in the above-described manner is supplied from the ACS unit 100(3) to the path memory 100(4). In the path memory 100(4), the data corresponding to each selected path is sequentially shifted, and, during the process, data corresponding to each unselected path is sequentially discarded so that data corresponding to a surviving path is output from the path memory 100(4) as output data. Thus, by recording data in a partial response (PR) waveform and detecting data of maximum likelihood (ML) by employing the Viterbi detector 100, data can be reproduced with high accuracy from the magneto-optical disk 100 on which data is recorded with high density.

In the above-described embodiments, the equalizer control unit 200 (see FIGS. 2 and 4) and the expected value setting unit 201 (see FIGS. 16 and 17) are separately treated. However, an equalizer control function and an expected value setting function can be provided in a single unit by sharing parts that the two units have in common Industrial Applicability As previously described, a data reproduction control method and apparatus, and an optical disk unit according to the present invention can reproduce data stably and more properly even when a reproduced signal varies locally due to a noise or includes a steady distortion. Therefore, the present invention is suitably applied to an apparatus that is desired to reproduce data stably from a recording medium such as an optical disk, a magneto-optical disk, or a magnetic disk on which data is recorded with high density.

What is claimed is:

1. An optical disk unit having a reproduction system including processing means for performing sampling and waveform equalization on a signal reproduced from an optical disk medium recorded with data in accordance with a code of partial response, and Viterbi detection means for determining, in accordance with a Viterbi decoding algorithm, reproduced data based on expected values defined by a waveform of the partial response and waveform-equalized sampled values obtained in the processing means, the optical disk unit comprising:

counting means for counting frequencies of levels of the sampled values; and equalization characteristic adjustment means for adjusting a waveform equalization characteristic in the waveform equalization so that a distribution of the frequencies of the levels obtained in said counting means approaches a distribution that is to be obtained based on the code of the partial response.

2. An optical disk unit having a reproduction system including a processing unit that performs sampling and waveform equalization on a signal reproduced from an optical disk medium recorded with data in accordance with a code of partial response, and a Viterbi detector that determines, in accordance with a Viterbi decoding algorithm, reproduced data based on expected values defined by a waveform of the partial response and waveform-equalized sampled values obtained in the processing unit, the optical disk unit comprising:

a counting part that counts frequencies of levels of the sampled values; and an equalization characteristic adjustment part that adjusts a waveform equalization characteristic in the waveform equalization so that a distribution of the frequencies of the levels obtained in said counting part approaches a distribution that is to be obtained based on the code of the partial response.

3. A data reproduction control method performing, at given intervals, sampling of a signal reproduced from a recording medium recorded with data in accordance with a code of partial response, and determining, in accordance with a Viterbi decoding algorithm, reproduced data based on expected values defined by a waveform of the partial response and sampled values obtained by the sampling, wherein:

frequencies of levels of the sampled values are counted; and the expected values are provided based on a distribution of the counted frequencies of the levels.

4. A data reproduction control apparatus performing, at given intervals, sampling of a signal reproduced from a recording medium recorded with data in accordance with a code of partial response, and determining, in accordance with a Viterbi decoding algorithm, reproduced data based on expected values defined by a waveform of the partial response and sampled values obtained by the sampling, the data reproduction control apparatus comprising:

counting means for counting frequencies of levels of the sampled values; and expected value setting means for setting the expected values based on a distribution of the frequencies of the levels obtained in said counting means.

5. An optical disk unit having a reproduction system including sampling means for sampling, at given intervals, a signal reproduced from an optical disk medium recorded with data in accordance with a code of partial response, and Viterbi detection means for determining, in accordance with a Viterbi decoding algorithm, reproduced data based on expected values defined by a waveform of the partial response and sampled values obtained in the sampling means, the optical disk unit comprising:

counting means for counting frequencies of levels of the sampled values; and expected value setting means for setting the expected values based on a distribution of the frequencies of the levels obtained in said counting means.

6. An optical disk unit having a reproduction system including a sampling unit that samples, at given intervals, a signal reproduced from an optical disk medium recorded with data in accordance with a code of partial response, and a Viterbi detector that determines, in accordance with a Viterbi decoding algorithm, reproduced data based on expected values defined by a waveform of the partial response and sampled values obtained in the sampling unit, the optical disk unit comprising:

a counting part that counts frequencies of levels of the sampled values; and an expected value setting unit that sets the expected values based on a distribution of the frequencies of the levels obtained in said counting part.

* * * * *